United States Patent
Nam et al.

(10) Patent No.: US 10,323,124 B2
(45) Date of Patent: Jun. 18, 2019

(54) POLYMER, ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Youn-Hee Nam, Suwon-si (KR); Seung-Hyun Kim, Suwon-si (KR); Hyo-Young Kwon, Suwon-si (KR); Sung-Hwan Kim, Suwon-si (KR); Ran Namgung, Suwon-si (KR); Soo-Hyoun Mun, Suwon-si (KR); Dominea Rathwell, Suwon-si (KR); Hyun-Ji Song, Suwon-si (KR); Hyeon-Il Jung, Suwon-si (KR); Yu-Mi Heo, Suwon-si (KR)

(73) Assignee: Samsung SDI Co., Ltd., Yongin-si, Gyeonggi-do (KR)

(*) Notice: Subject to any disclaimer, the term of this patent is extended or adjusted under 35 U.S.C. 154(b) by 0 days.

(21) Appl. No.: 14/734,748

(22) Filed: Jun. 9, 2015

(65) Prior Publication Data
US 2016/0090449 A1 Mar. 31, 2016

(30) Foreign Application Priority Data
Sep. 30, 2014 (KR) ........................ 10-2014-0131589

(51) Int. Cl.
*G03F 7/09* (2006.01)
*G03F 7/11* (2006.01)
(Continued)

(52) U.S. Cl.
CPC ....... *C08G 73/0672* (2013.01); *C08G 61/124* (2013.01); *C08L 65/00* (2013.01);
(Continued)

(58) Field of Classification Search
CPC ............. H01L 21/0271; H01L 21/0274; H01L 21/0276; H01L 21/3081; H01L 21/31144;
(Continued)

(56) References Cited

U.S. PATENT DOCUMENTS 8,741,540 B2 * 6/2014 Kim ........................ G03F 7/094
430/270.1
8,999,624 B2 * 4/2015 Chen .................. C09D 133/066
430/270.1
(Continued)

FOREIGN PATENT DOCUMENTS

CN 102803324 A 11/2012
CN 103229104 A 7/2013
(Continued)

OTHER PUBLICATIONS

Taiwanese Search Report dated Jan. 19, 2016.

*Primary Examiner* — Erik Kielin
(74) *Attorney, Agent, or Firm* — Lee & Morse, P.C.

(57) ABSTRACT

A polymer including a moiety represented by Chemical Formula 1, an organic layer composition including the polymer, an organic layer manufactured from the organic layer composition, and a method of forming patterns using the organic layer composition are provided.
The definitions of the Chemical Formula 1 are the same as defined in the detailed description.

15 Claims, 1 Drawing Sheet

(51) Int. Cl.
*G03F 7/16* (2006.01)
*G03F 7/20* (2006.01)
*G03F 7/32* (2006.01)
*G03F 7/36* (2006.01)
*C08G 61/12* (2006.01)
*C08G 73/06* (2006.01)
*C08L 65/00* (2006.01)
*C08L 79/04* (2006.01)
*H01L 21/02* (2006.01)
*C09D 165/00* (2006.01)
*C09D 179/04* (2006.01)
*H01L 21/027* (2006.01)
*H01L 21/308* (2006.01)
*H01L 21/311* (2006.01)
*H01L 21/324* (2006.01)

(52) U.S. Cl.
CPC ............ *C08L 79/04* (2013.01); *C09D 165/00* (2013.01); *C09D 179/04* (2013.01); *G03F 7/091* (2013.01); *G03F 7/094* (2013.01); *G03F 7/11* (2013.01); *G03F 7/162* (2013.01); *G03F 7/168* (2013.01); *G03F 7/20* (2013.01); *G03F 7/32* (2013.01); *G03F 7/36* (2013.01); *H01L 21/0271* (2013.01); *H01L 21/0274* (2013.01); *H01L 21/0276* (2013.01); *H01L 21/02118* (2013.01); *H01L 21/02282* (2013.01); *H01L 21/3081* (2013.01); *H01L 21/31144* (2013.01); *H01L 21/324* (2013.01); *C08G 2261/12* (2013.01); *C08G 2261/148* (2013.01); *C08G 2261/312* (2013.01); *C08G 2261/3142* (2013.01); *C08G 2261/3241* (2013.01); *C08G 2261/3424* (2013.01)

(58) Field of Classification Search
CPC ... H01L 21/324; C08G 73/0672; C08L 79/04; G03F 7/11; G03F 7/20; G03F 7/32; G03F 7/36; G03F 7/162; G03F 7/168
USPC ................. 438/703, 694; 430/270.1
See application file for complete search history.

(56) References Cited

U.S. PATENT DOCUMENTS

| | | | | |
|---|---|---|---|---|
| 9,593,205 | B2* | 3/2017 | Mun | C08G 73/0672 |
| 9,758,612 | B2* | 9/2017 | Namgung | C08G 12/00 |
| 9,971,243 | B2* | 5/2018 | Park | C08G 61/122 |
| 10,066,057 | B2* | 9/2018 | Park | C08G 73/0672 |
| 2012/0064725 | A1* | 3/2012 | Kinsho | G03F 7/091 |
| | | | | 438/703 |
| 2012/0077345 | A1* | 3/2012 | Saito | C08G 12/26 |
| | | | | 438/703 |
| 2013/0189618 | A1* | 7/2013 | Yokoya | G03F 7/20 |
| | | | | 430/270.1 |
| 2014/0170567 | A1* | 6/2014 | Sakamoto | C08G 73/06 |
| | | | | 430/319 |
| 2015/0044876 | A1* | 2/2015 | Nishimaki | G03F 7/091 |
| | | | | 438/703 |
| 2015/0185606 | A1* | 7/2015 | Kitagawa | C08F 2/48 |
| | | | | 438/694 |
| 2015/0364332 | A1* | 12/2015 | Nakagawa | G03F 7/094 |
| | | | | 438/694 |
| 2016/0068709 | A1* | 3/2016 | Endo | G03F 7/091 |
| | | | | 438/703 |

FOREIGN PATENT DOCUMENTS

| | | |
|---|---|---|
| JP | 4720988 B2 | 7/2011 |
| JP | 2012-214720 A | 11/2012 |
| JP | WO 2013/146670 A1 * | 3/2013 |
| JP | 2014-029435 A | 2/2014 |
| JP | 2014-174329 A | 9/2014 |
| KR | 10-1156488 B1 | 6/2012 |
| KR | 10-1311942 B1 | 9/2013 |
| KR | 2013-0130005 A | 11/2013 |
| KR | 10-1344792 B1 | 12/2013 |
| KR | 10-2014-0083844 A | 7/2014 |
| TW | 201407290 | 2/2014 |
| WO | WO 2010/147155 A1 | 12/2010 |
| WO | WO 2012/096071 A1 | 7/2012 |

* cited by examiner

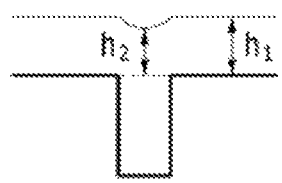
$$\text{Planarization} = \left(1 - \frac{h_2}{h_1}\right) \times 100$$

POLYMER, ORGANIC LAYER COMPOSITION, ORGANIC LAYER, AND METHOD OF FORMING PATTERNS

CROSS-REFERENCE TO RELATED APPLICATION

Korean Patent Application No. 10-2014-0131589, filed on Sep. 30, 2014, in the Korean Intellectual Property Office, and entitled: "Polymer, Organic Layer Composition, Organic Layer, and Method of Forming Patterns," is incorporated by reference herein in its entirety.

BACKGROUND

1. Field

Embodiments relate to a polymer, an organic layer composition including the polymer, an organic layer manufactured from the organic layer composition and a method of forming patterns using the organic layer composition.

2. Description of the Related Art

Recently, the semiconductor industry has developed to an ultra-fine technique having a pattern of several to several tens nanometer in size. Effective lithographic techniques are important for such ultrafine techniques. A general lithographic technique includes providing a material layer on a semiconductor substrate; coating a photoresist layer thereon; exposing and developing the same to provide a photoresist pattern; and etching the material layer using the photoresist pattern as a mask.

SUMMARY

Embodiments are directed to a polymer including a moiety represented by the following Chemical Formula 1,

[Chemical Formula 1]

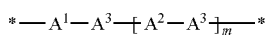

In the Chemical Formula 1, $A^1$ and $A^2$ may independently be a divalent group derived from one of the compounds listed in the following Group 1, $A^3$ may be one of the groups listed in the following Group 2, and m may be 0 or 1.

[Group 1]

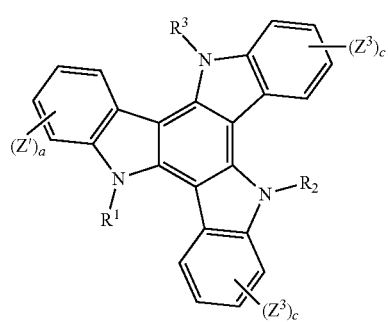

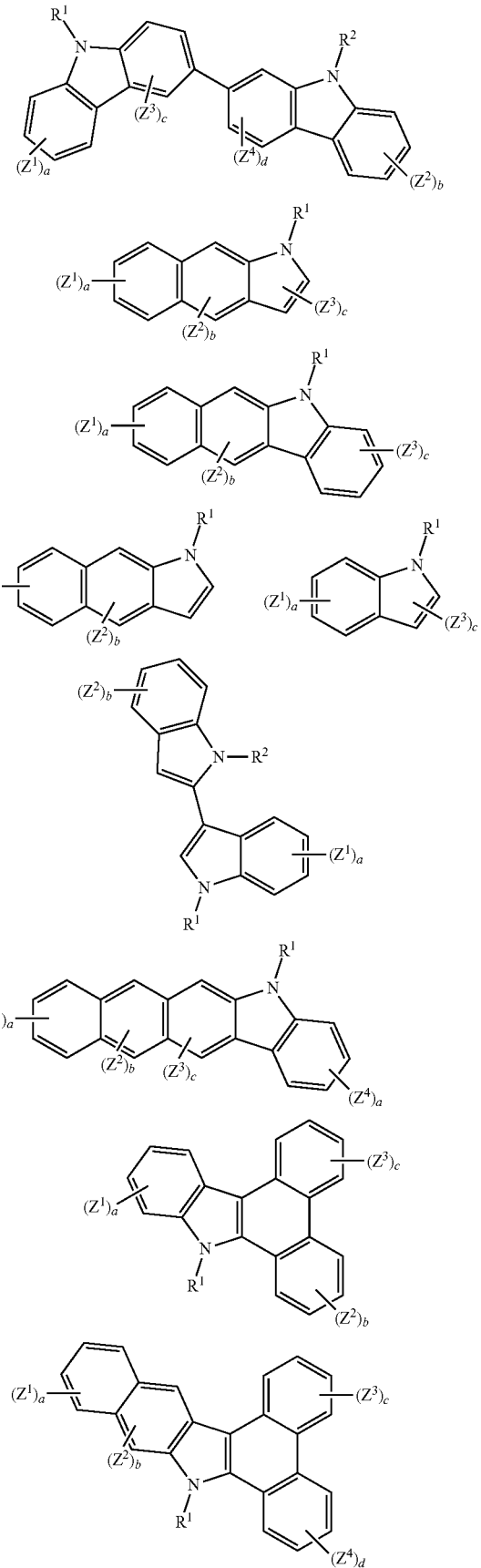

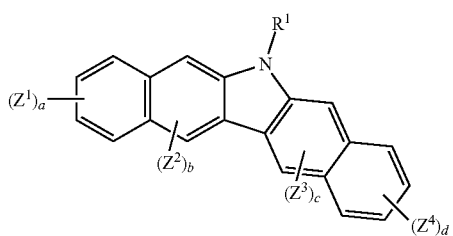
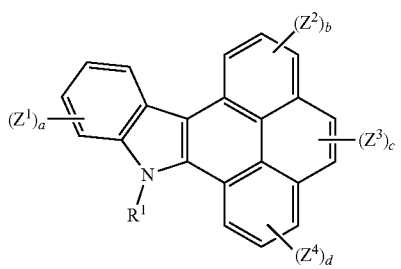
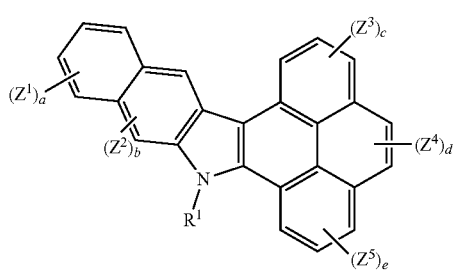
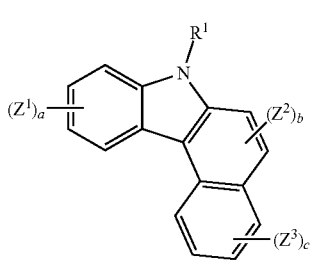
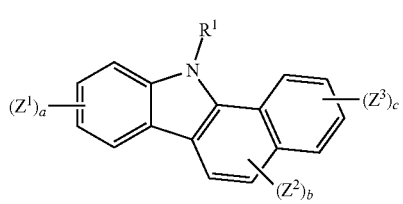
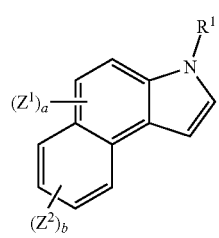
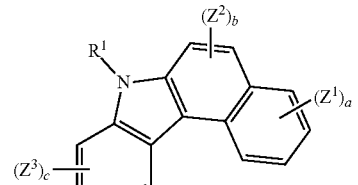
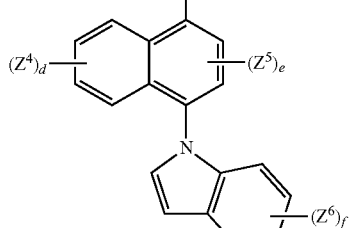
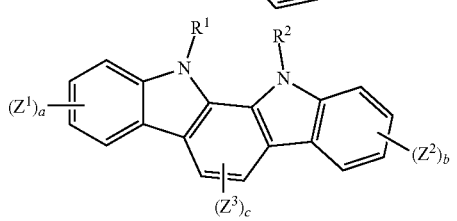
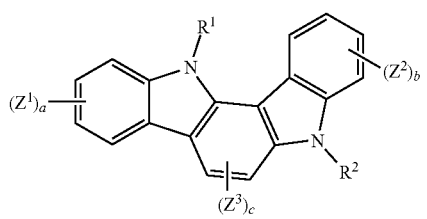
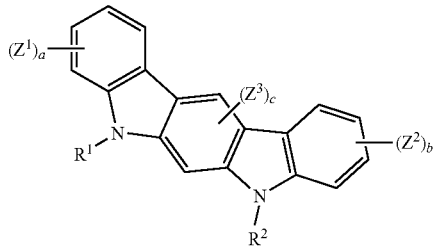
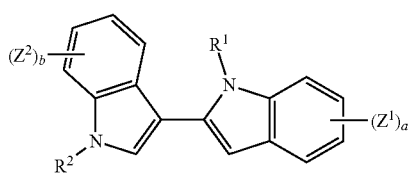
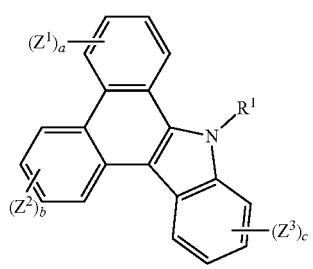

-continued

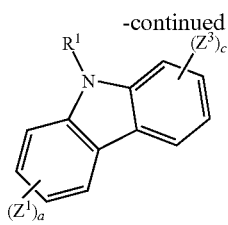

In the Group 1,

R$^1$, R$^2$ and R$^3$ may independently be hydrogen (—H), a hydroxy group (—OH), oxygen (O), a methoxy group (—OCH$_3$), an ethoxy group (—OC$_2$H$_5$), a halogen (—F, —Cl, —Br, —I), a substituted or unsubstituted C6 to C30 aryl group, or a combination thereof, Z$^1$ to Z$^6$ may independently be a hydroxy group (—OH), a methoxy group (—OCH$_3$), an ethoxy group (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e and f may independently be integers of 0 to 2.

[Group 2]

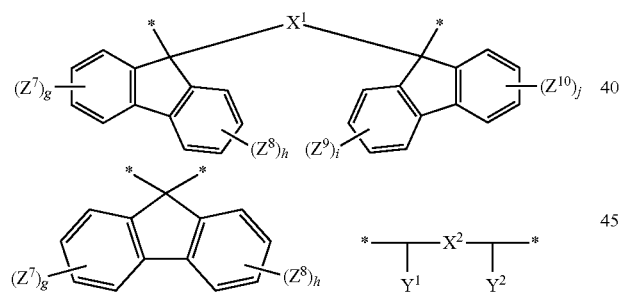

In the Group 2,

X$^1$ and X$^2$ may independently be a substituted or unsubstituted C6 to C50 arylene group, a substituted or unsubstituted C1 to C10 alkylene oxide-containing group, or a combination thereof, Y$^1$ and Y$^2$ may independently be a substituted or unsubstituted C6 to C30 aryl group, Z$^7$ to Z$^{10}$ may independently be a hydroxy group (—OH), a methoxy group (—OCH$_3$), an ethoxy group (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and g, h, i and j may independently be integers of 0 to 2.

In the Group 2, X$^1$ and X$^2$ may independently be a divalent group derived from one of the compounds listed in the following Group 3.

[Group 3]

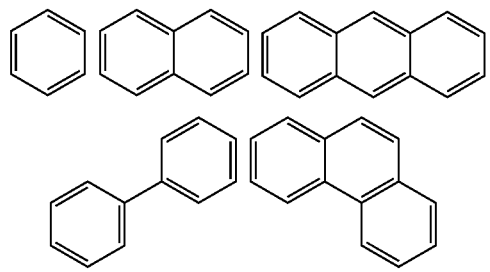

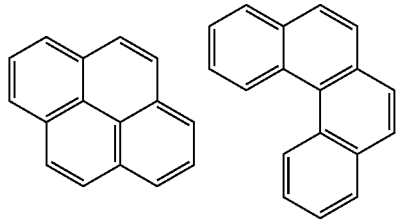

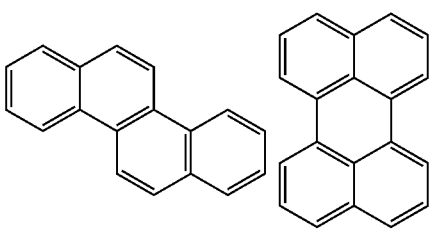

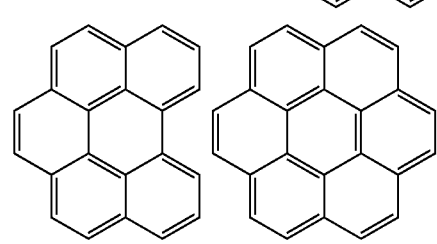

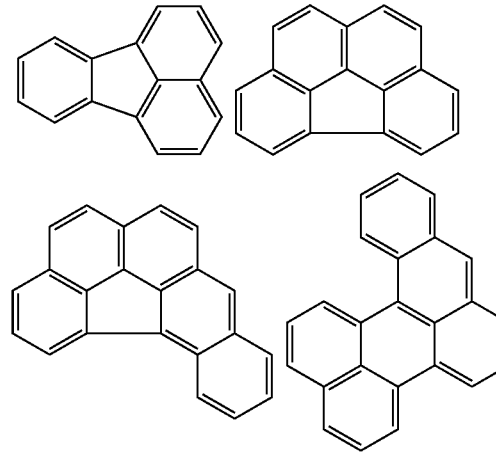

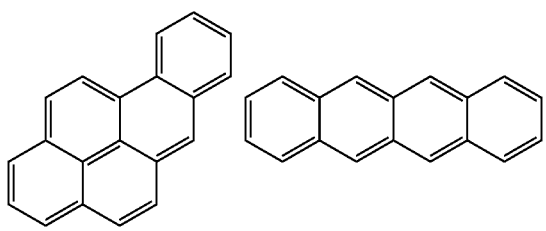
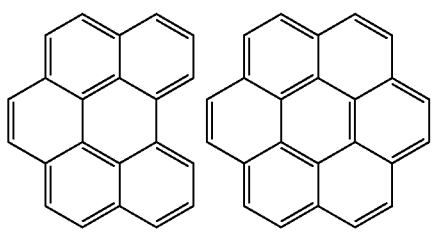

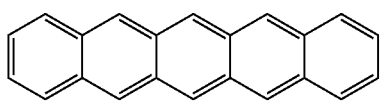 [SMILES: c1ccc2cc3cc4cc5ccccc5cc4cc3cc2c1]

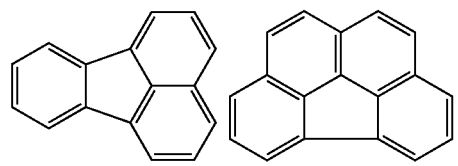

In the Group 2, Y$^1$ and Y$^2$ may independently be a monovalent group derived from one of the compounds listed in the following Group 3.

[Group 3]

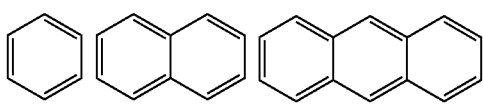

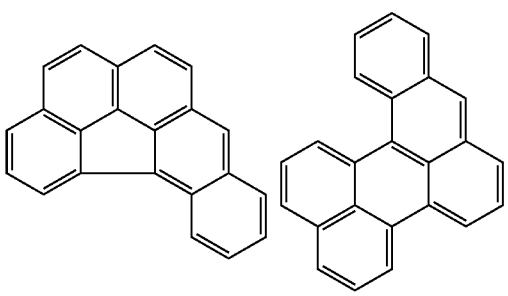

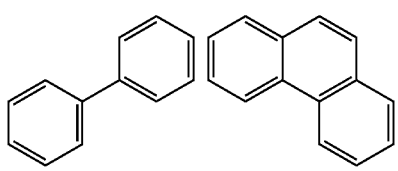

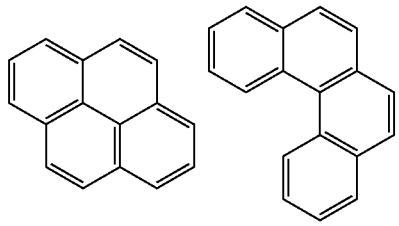

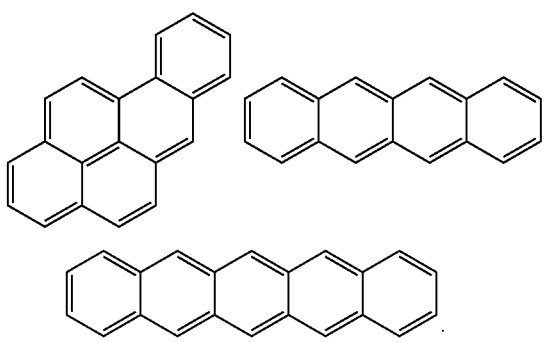

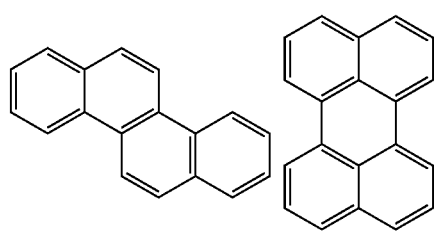

In the Group 2, at least one of X$^2$, Y$^1$ and Y$^2$ may be a group derived from a substituted or unsubstituted benzene, a substituted or unsubstituted naphthalene, a substituted or unsubstituted biphenyl, a substituted or unsubstituted pyrene, a substituted or unsubstituted perylene, a substituted or unsubstituted benzoperylene, a substituted or unsubstituted coronene, or a combination thereof.

In the Group 1, R$^1$, R$^2$ and R$^3$ may independently be hydrogen (—H), or a substituted or unsubstituted phenyl group.

The polymer may be represented by one of the following Chemical Formulae 2-1 to 2-10.

[Chemical Formula 2-1]
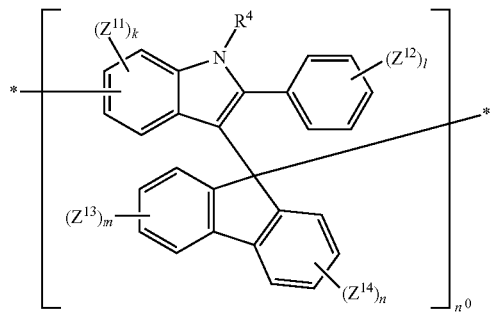
[Chemical Formula 2-2]
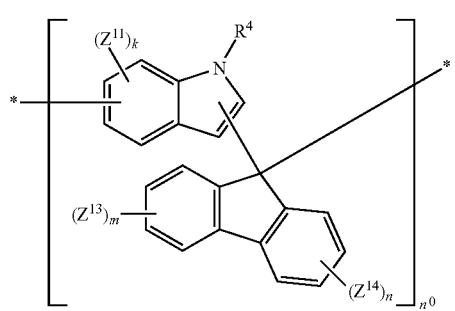
[Chemical Formula 2-3]
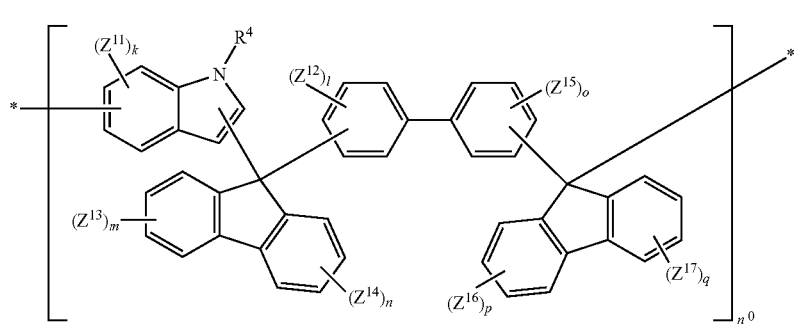
[Chemical Formula 2-4]
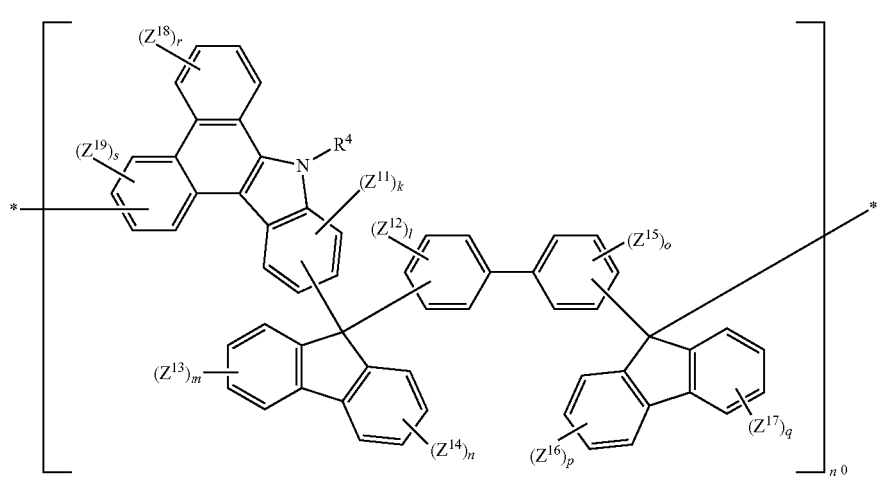

[Chemical Formula 2-5]
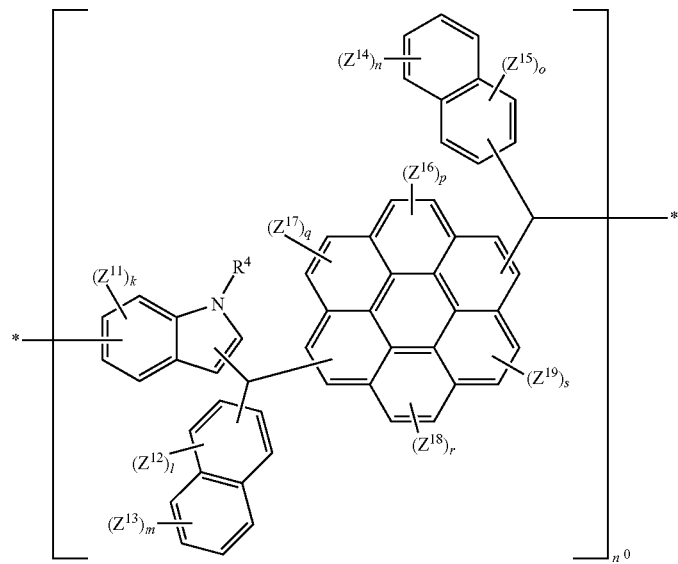
[Chemical Formula 2-6]
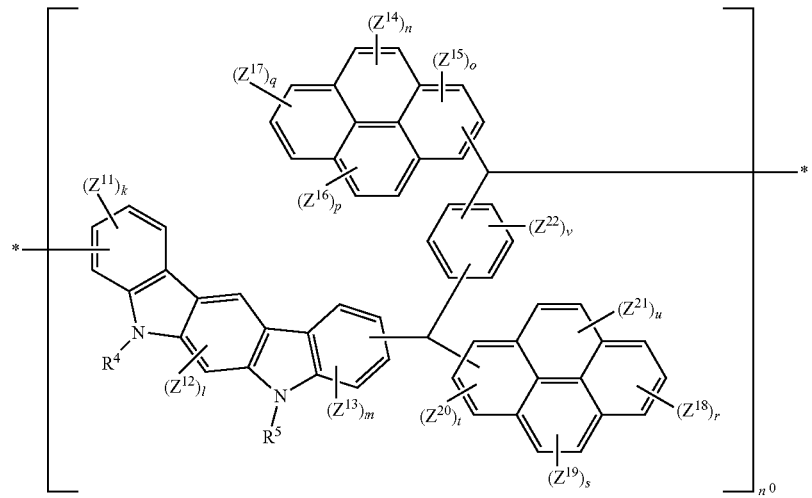
[Chemical Formula 2-7]
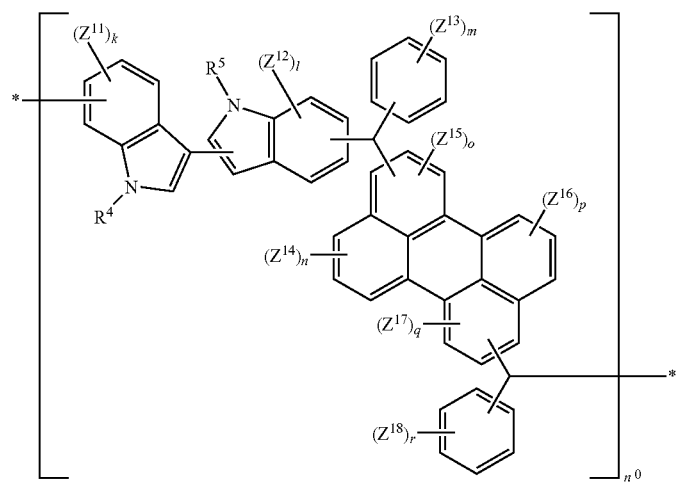

[Chemical Formula 2-8]

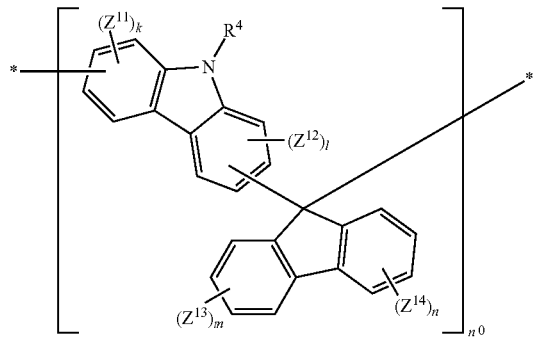

[Chemical Formula 2-9]

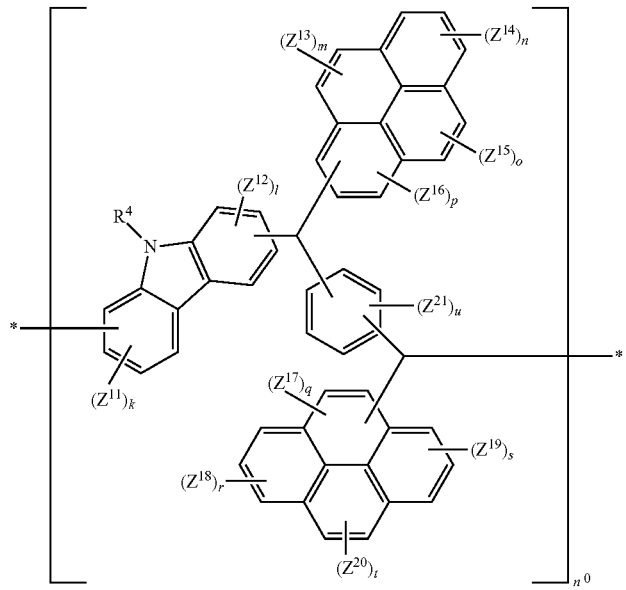

[Chemical Formula 2-10]

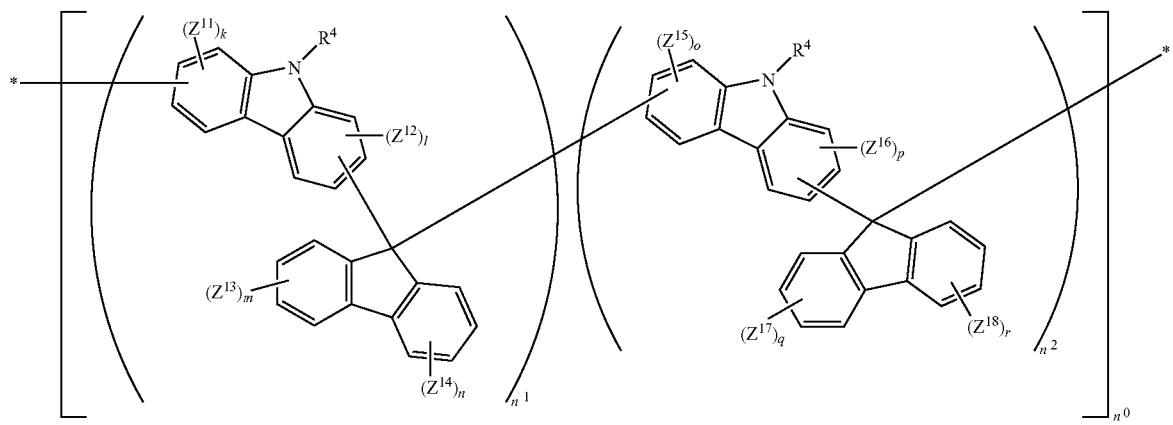

In the Chemical Formulae 2-1 to 2-10, $R^4$ and $R^5$ may independently be hydrogen (—H), oxygen (O), methoxy (—OCH$_3$), ethoxy (—OC$_2$H$_5$), a hydroxy group (—OH), a halogen (—F, —Cl, —Br, —I), a substituted or unsubstituted C6 to C30 aryl group, or a combination thereof, $Z^{11}$ to $Z^{22}$ may independently be a hydroxy group (—OH), a methoxy (—OCH$_3$), ethoxy (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, t, u and v may independently be integers of 0 to 2, and $n^0$, $n^1$ and $n^2$ may be integers of 2 to 300.

The polymer may have a weight average molecular weight of about 1,000 to about 200,000.

Embodiments are also directed to an organic layer composition including the polymer according to an embodiment and a solvent.

The polymer may be included in an amount of about 0.1 wt % to about 30 wt % based on the total weight of the organic layer composition.

Embodiments are also directed to an organic layer formed by curing the organic layer composition according to an embodiment.

Embodiments are also directed to a method of forming patterns that includes providing a material layer on a substrate, applying the organic layer composition according to an embodiment on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The process of forming the organic layer may include heat-treating at about 100° C. to about 500° C.

The method may further include forming a bottom anti-reflective coating (BARC) before forming the photoresist layer.

BRIEF DESCRIPTION OF THE DRAWING

Features will become apparent to those of skill in the art by describing in detail exemplary embodiments with reference to the attached drawing in which:

FIG. 1 illustrates Calculation Equation 2 for evaluating planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration. Like reference numerals refer to like elements throughout.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

As used herein, when a definition is not otherwise provided, '*' indicates a linking point of a compound or compound moiety.

In addition, 'a monovalent group' derived from an A compound refers to a monovalent group substituting one hydrogen in the A compound. For example, a monovalent group derived from a benzene group becomes a phenyl group. In addition, 'a divalent group' derived from an A compound refers to a divalent group substituting two hydrogen to form two linking points in the A compound. For example, a divalent group derived from a benzene group becomes a phenylene group.

Hereinafter, a polymer according to an example embodiment is described.

A polymer according to an example embodiment includes a moiety represented by the following Chemical Formula 1.

[Chemical Formula 1]

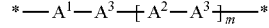

In the present example embodiment, in the Chemical Formula 1, $A^1$ and $A^2$ are independently a divalent group derived from one of the compounds listed in the following Group 1, $A^3$ is one of the groups listed in the following Group 2, and m is 0 or 1.

[Group 1]

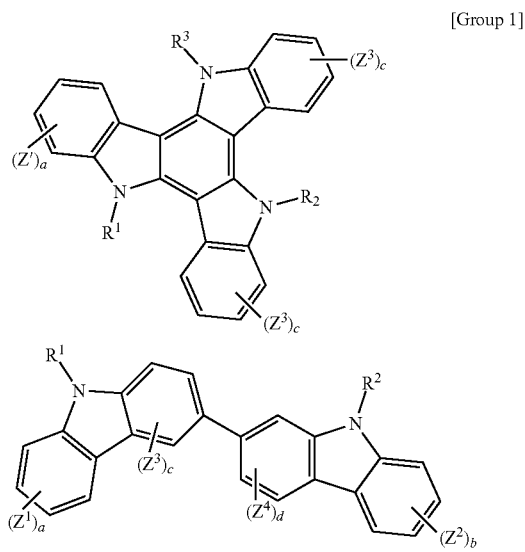

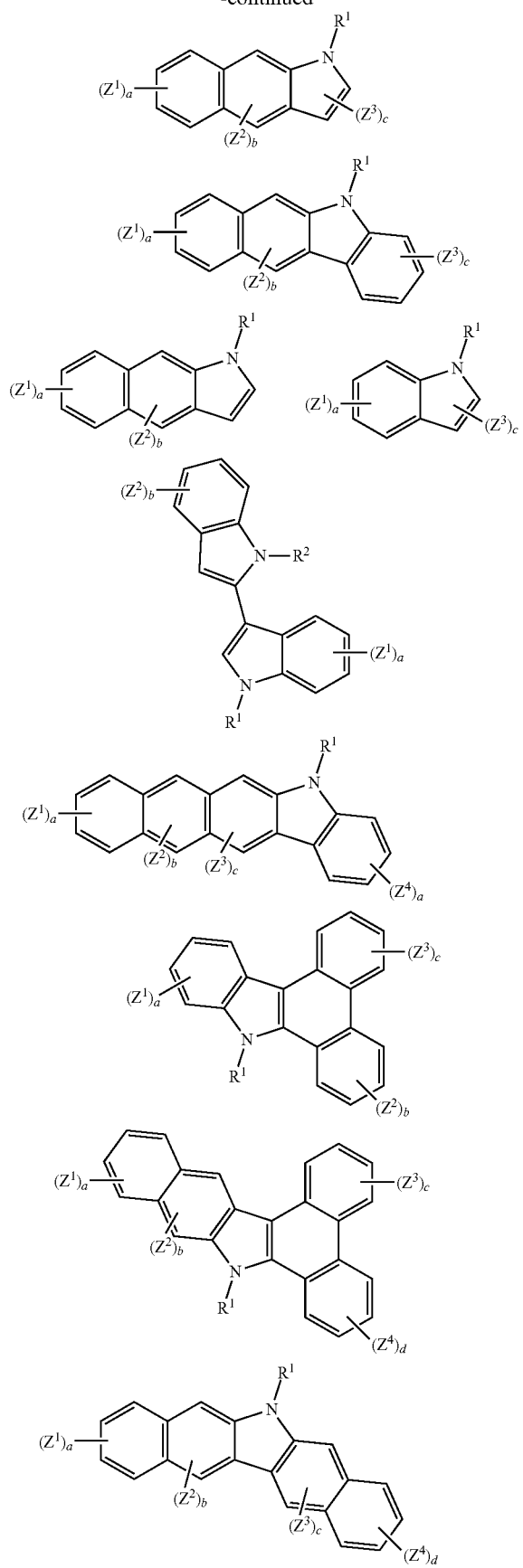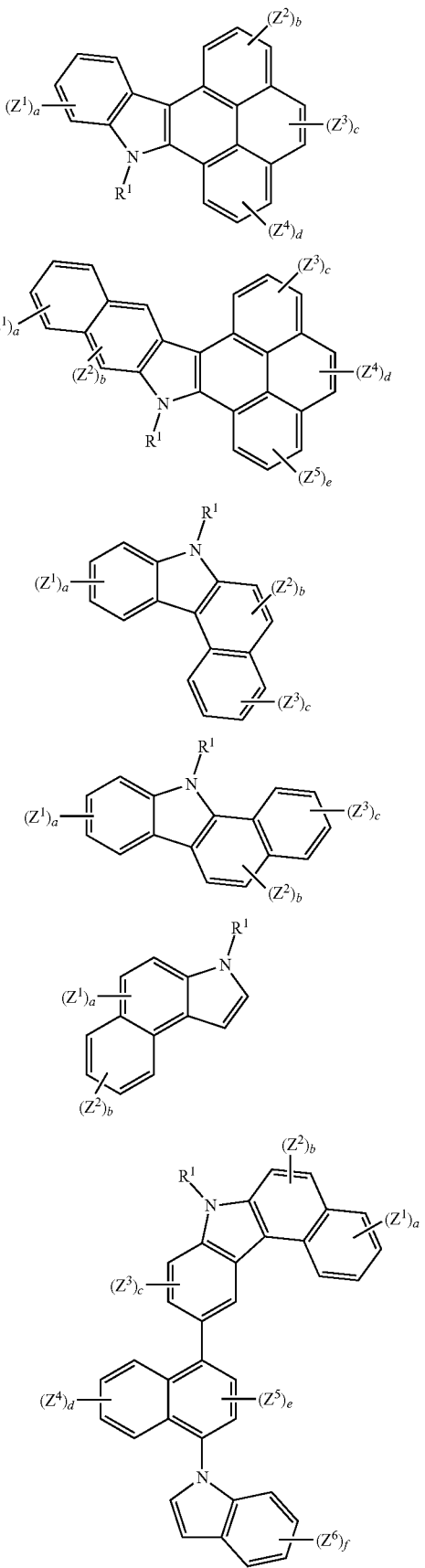

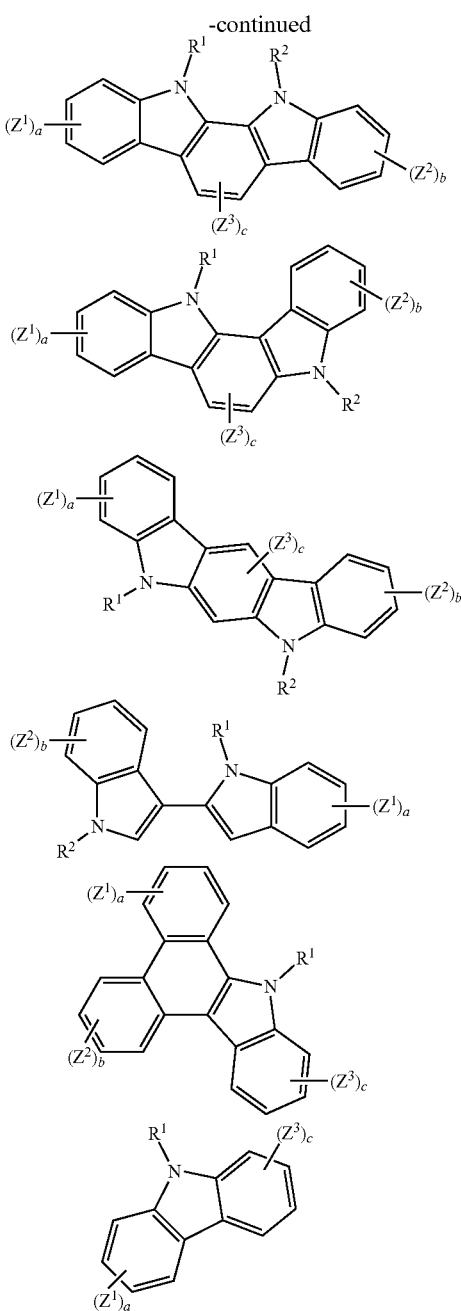

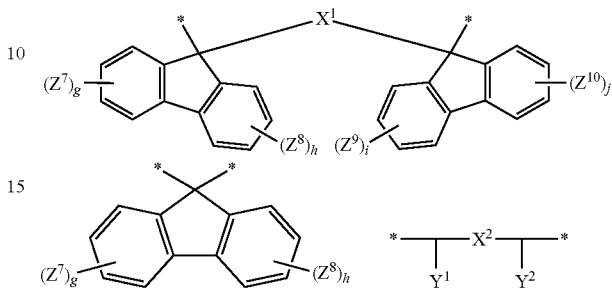

In the Group 1,

R¹, R² and R³ are independently hydrogen (—H), a hydroxy group (—OH), oxygen (O), methoxy (—OCH₃), ethoxy (—OC₂H₅), a halogen (—F, —Cl, —Br, —I), a substituted or unsubstituted C6 to C30 aryl group, or a combination thereof, Z¹ to Z⁶ are independently a hydroxy group (—OH), a methoxy (—OCH₃), ethoxy (—OC₂H₅), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e and f are independently integers of 0 to 2.

In the Group 2,

X¹ and X² are independently a substituted or unsubstituted C6 to C50 arylene group, a substituted or unsubstituted C1 to C10 alkyleneoxide-containing group, or a combination thereof, Y¹ and Y² are independently a substituted or unsubstituted C6 to C30 aryl group, Z⁷ to Z¹⁰ are independently a hydroxy group (—OH), a methoxy (—OCH₃), ethoxy (—OC₂H₅), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and g, h, i and j are independently integers of 0 to 2.

According to the present example embodiment, the polymer has a structure of minimizing benzylic hydrogen but maximizing a ring parameter. The polymer may help provide excellent etch resistances.

In addition, the polymer includes at least either one of a tertiary carbon and a quaternary carbon in its monomer structure. In the present specification, the tertiary carbon indicates carbon bonded with three other groups substituting three hydrogens out of all four hydrogens bonded therein, while the quaternary carbon indicates carbon bonded with four other groups substituting all the four hydrogens.

The polymer including these carbons is included in an organic layer composition may exhibit improved dissolution for a hardmask layer, which may help when using a spin-on coating method. A moiety of a compound including the tertiary or quaternary carbon is the same as shown in the Group 2.

The polymer may include at least one moiety represented by the Chemical Formula 1, and a plurality of the moieties may have the same structure or a different structure one another.

For example, in the Group 2, X¹ and X² may be a divalent group derived from one of the compounds listed in the following Group 3.

[Group 3]

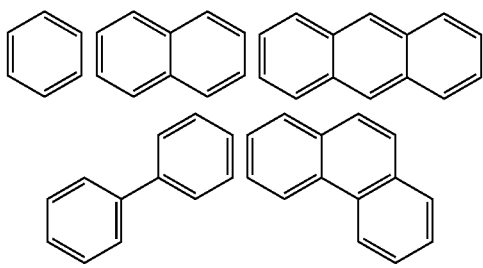
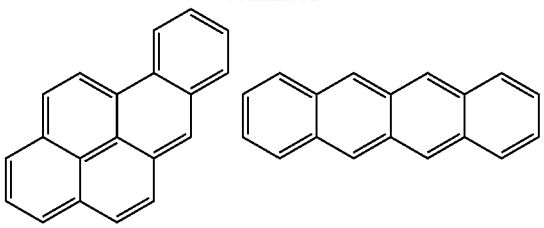
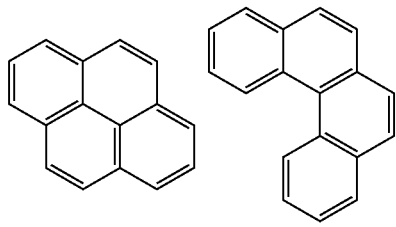
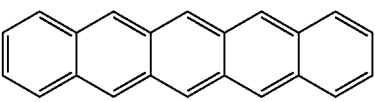 [SMILES: c1ccc2cc3cc4cc5ccccc5cc4cc3cc2c1]

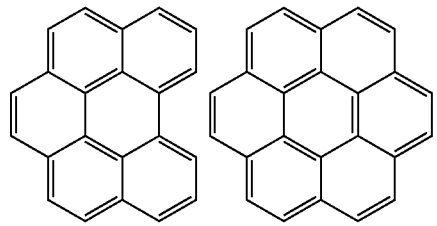
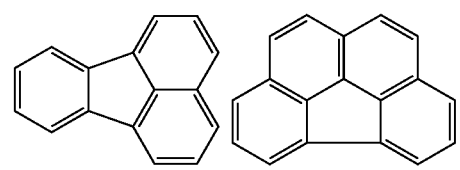
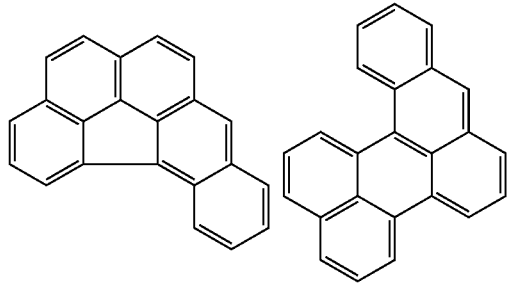

The aromatic ring groups provided in the Group 3 may be substituted or unsubstituted groups.

For example, at least either one of $X^1$ and $X^2$ in the Group 2 may have a structure of including an alkyleneoxide group like the following linking group A.

[Linking Group A]

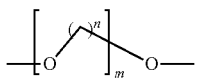

In the linking group A, n and m are independently an integer ranging from 1 to 10.

For example, in the Group 2, $Y^1$ and $Y^2$ may independently be a monovalent group derived from one of the compounds listed in the Group 3.

The polymer may include at least one polycyclic aromatic ring group in a moiety represented by the Chemical Formula 1, which may help provide desirable optical properties of the polymer and improve etch resistance.

For example, in the Group 2, at least one of $X^2$, $Y^1$ and $Y^2$ may be a group derived from a substituted or unsubstituted benzene, a substituted or unsubstituted naphthalene, a substituted or unsubstituted biphenyl, a substituted or unsubstituted pyrene, a substituted or unsubstituted perylene, a substituted or unsubstituted benzoperylene, a substituted or unsubstituted coronene, a combination thereof, etc.

Properties of the polymer may be easily adjusted by selecting a kind and the number of $Z^1$ to $Z^{10}$ representing a functional group substituted in a cyclic group.

For example, $R^1$, $R^2$ and $R^3$ representing a functional group bonded to a nitrogen (N) atom in the Chemical Formula 1 are independently hydrogen (—H) or a substituted or unsubstituted phenyl group, etc.

The polymer may be, for example, represented by one of the following Chemical Formulae 2-1 to 2-10.

[Chemical Formula 2-1]
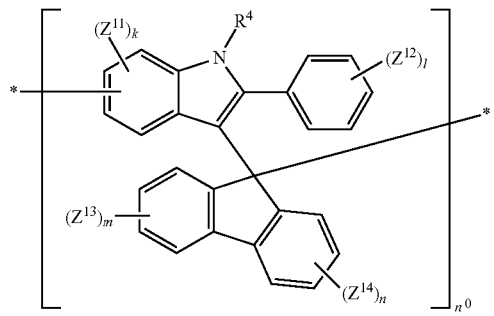
[Chemical Formula 2-2]
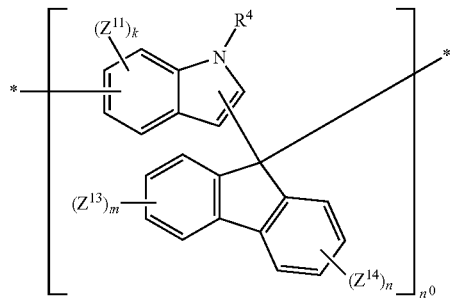
[Chemical Formula 2-3]
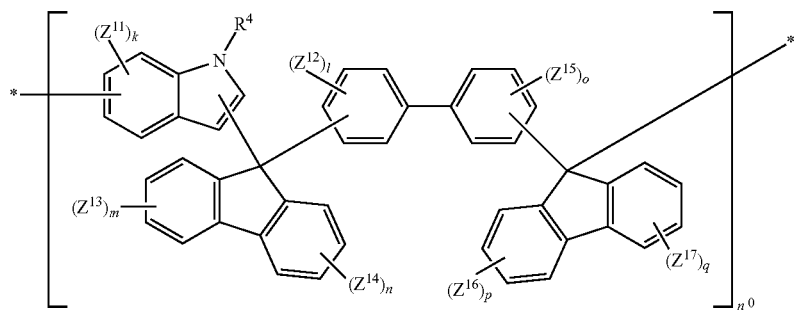
[Chemical Formula 2-4]
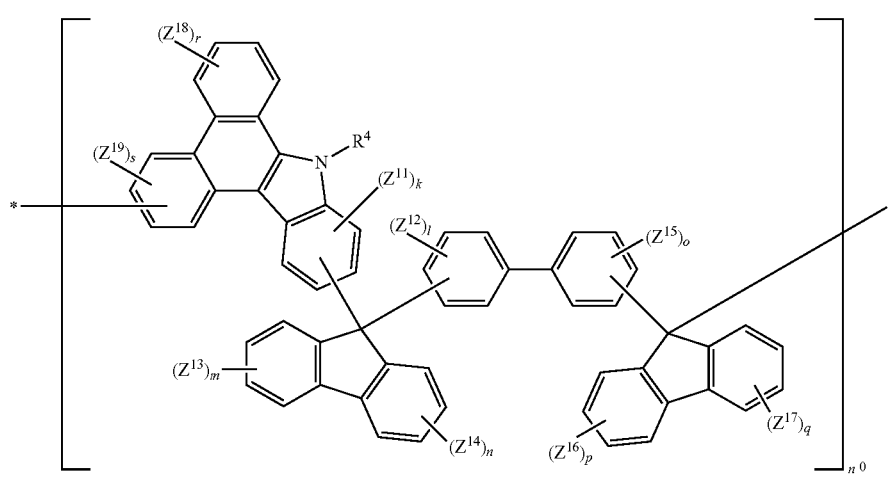

[Chemical Formula 2-5]
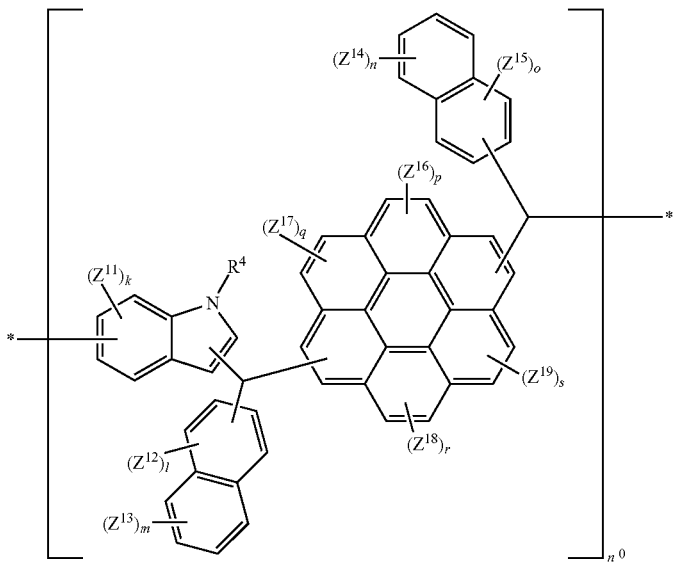
[Chemical Formula 2-6]
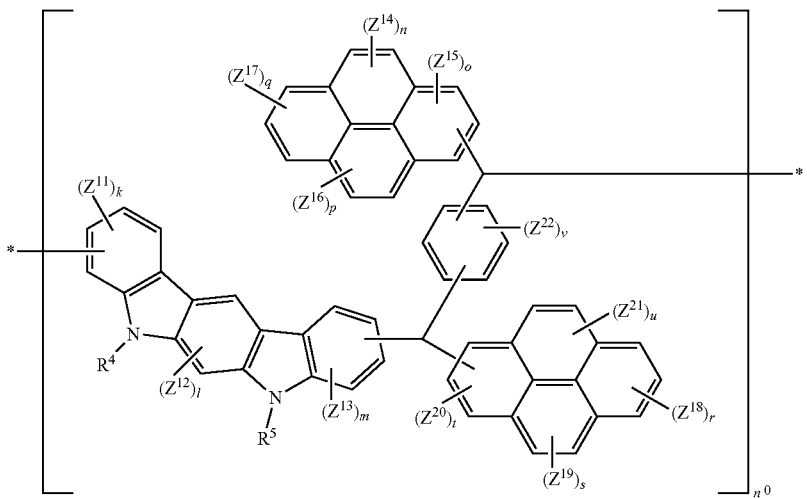
[Chemical Formula 2-7]
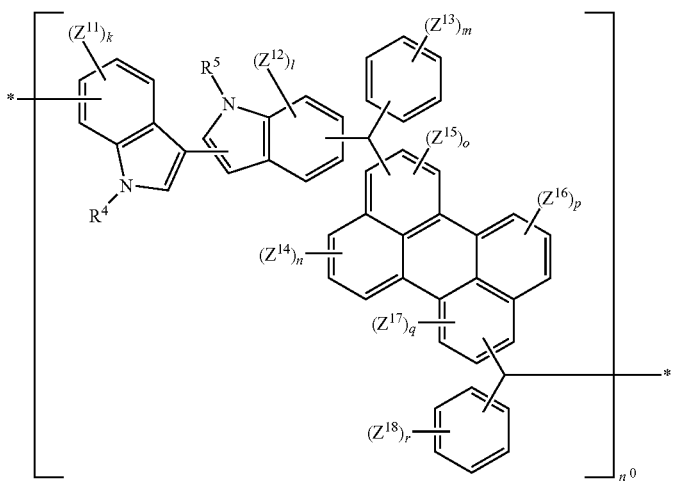

[Chemical Formula 2-8]

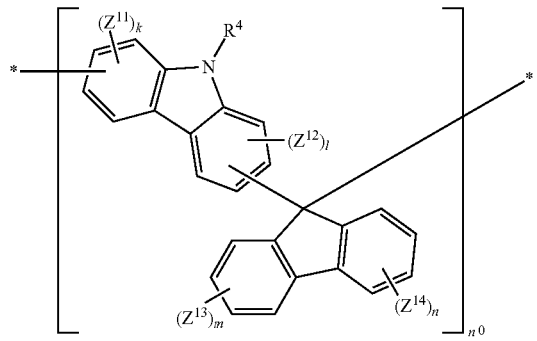

[Chemical Formula 2-9]

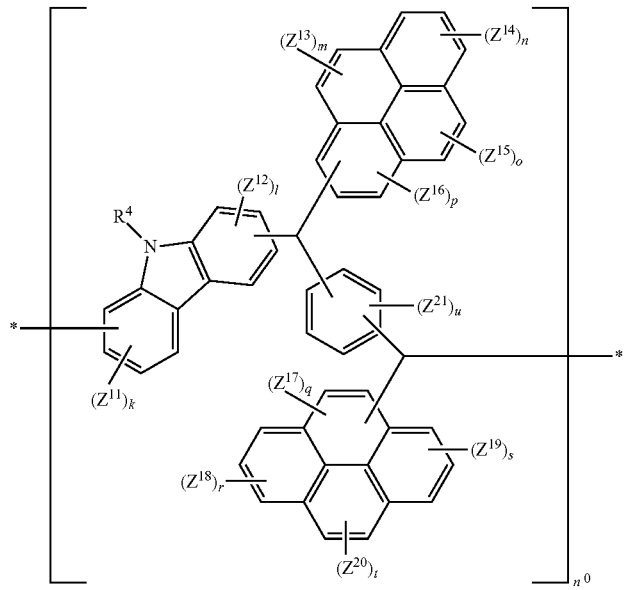

[Chemical Formula 2-10]

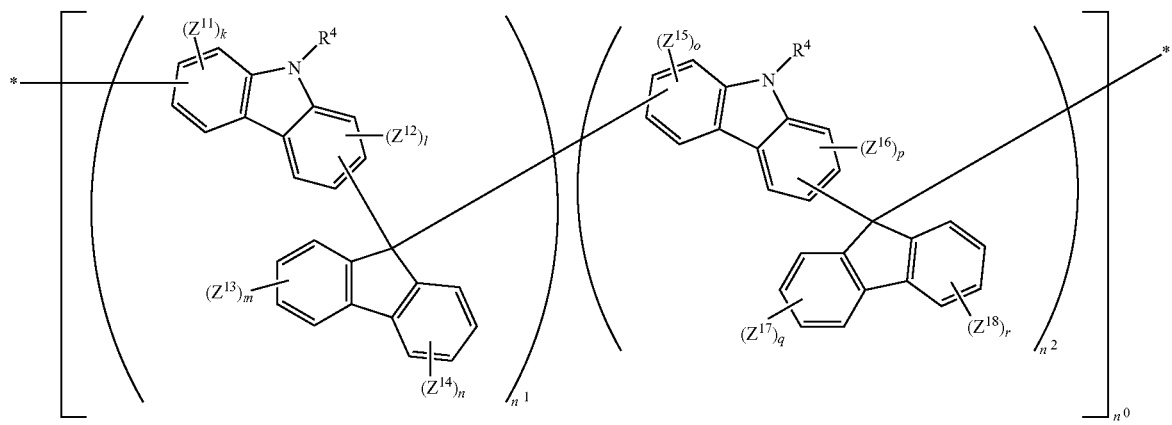

In the Chemical Formulae 2-1 to 2-10, $R^4$ and $R^5$ are independently hydrogen (—H), a hydroxy group (—OH), an oxygen (O), a halogen (—F, —Cl, —Br, —I), a substituted or unsubstituted C6 to C30 aryl group, or a combination thereof, $Z^{11}$ to $Z^{22}$ are independently a hydroxy group (—OH), a methoxy (—OCH$_3$), ethoxy (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, t, u and v are independently integers of 0 to 2, and $n^0$, $n^1$ and $n^2$ are integers of 2 to 300.

The polymer may have a weight average molecular weight of about 1,000 to about 200,000. When the polymer has a weight average molecular weight within the range, the carbon amount and solubility of an organic layer composition including the polymer (e.g., a hardmask composition) may be adjusted and thus, optimized.

According to another example embodiment, an organic layer composition including the polymer according to an embodiment and a solvent is provided.

The solvent may be a suitable solvent for dissolving or dispersing the polymer and may include, for example, one or more of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, methylpyrrolidone, or acetylacetone.

The polymer may be included in an amount of, for example, about 0.1 to about 30 wt % based on the total weight of the organic layer composition. When the polymer is included within the range, a thickness, surface roughness and planarization of the organic layer may be controlled.

The organic layer composition may further include an additive, for example, a surfactant, a cross-linking agent, a thermal acid generator, a plasticizer, etc.

The surfactant may include, for example, alkylbenzene sulfonate salt, alkyl pyridinium salt, polyethylene glycol, a quaternary ammonium salt, etc.

The cross-linking agent may be, for example, a melamine-based agent, a substituted urea-based agent, or a polymer-based agent. A cross-linking agent having at least two cross-linking forming substituents may be, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, etc.

The thermal acid generator may be, for example, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, etc.

The additive may be included in an amount of, for example, about 0.001 to 40 parts by weight based on 100 parts by weight of the organic layer composition. When the additive is included within the range, solubility may be improved without changing optical properties of the organic layer composition.

According to another example embodiment, an organic layer manufactured using the organic layer composition according to an embodiment is provided. The organic layer may be, for example, formed by coating the organic layer composition on a substrate and heat-treating it for curing and may include, for example, a hardmask layer, a planarization layer, a sacrificial layer, a filler, and the like for an electronic device.

Hereafter, a method for forming patterns by using the organic layer composition is described.

A method of forming patterns according to an example embodiment includes providing a material layer on a substrate, applying the organic layer composition including the polymer according to an embodiment and the solvent on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned, for example a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. Herein, a thickness of the organic layer composition is not particularly limited, but may be, for example about 50 Å to about 10,000 Å.

The heat-treating the organic layer composition may be performed, for example about 100 to about 500° C. for about 10 seconds to 1 hour.

The silicon-containing thin layer may be formed of, for example a material such as SiCN, SiOC, SiON, SiOCN, SiC and/or SiN and the like.

The method may further include forming a bottom anti-reflective coating (BARC) before forming the photoresist layer.

Exposure of the photoresist layer may be performed using, for example, ArF, KrF, or EUV light. After exposure, heat treatment may be performed at, for example, about 100° C. to about 500° C.

The etching process of the exposed part of the material layer may be performed through a dry etching process using an etching gas and the etching gas may be, for example, $CHF_3$, $CF_4$, $Cl_2$, $BCl_3$, a mixed gas thereof, etc.

The etched material layer may be formed in a plurality of patterns, and the plurality of patterns may be or include one or more of a metal pattern, a semiconductor pattern, an insulation pattern, etc., for example, diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Comparative Synthesis Example 1

21.6 g (0.057 mol) of 9,9-bis(4-methoxyphenyl)-9H-fluorene and 9.6 g (0.057 mol) of 1,4-bis(methoxymethyl)benzene were sequentially in a 500 ml flask equipped with a thermometer, a condenser and a mechanical agitator and then, dissolved in 51 g of propylene glycol monomethyl ether acetate (PGMEA). Then, 0.15 g (0.001 mol) of diethyl sulfite was added thereto, and the mixture was agitated at 90 to 120° C. for 5 to 10 hours. The reaction was terminated when a sample taken from the polymerization reactant at every one hour 1 had a weight average molecular weight of 1,800 to 2,300.

When the polymerization reaction was terminated, the reactant was subsequently cooled down to room temperature, and then added thereto were 40 g of distilled water and 400 g of methanol, and the mixture was strongly agitated and allowed to stand. Then, a precipitate obtained after removing a supernatant therefrom was dissolved in 80 g of propyleneglycol monomethyl ether acetate (PGMEA), the solution was strongly agitated by using 40 g of methanol and 40 g of water, and then allowed to stand (First process). Then, a precipitate obtained after removing a supernatant obtained therefrom was dissolved in 40 g of propylene glycol monomethyl ether acetate (PGMEA) (Second process). The first and second processes were regarded as one purification process, and this purification process was performed three times in total. The purified polymer was dissolved in 80 g of propylene glycol monomethyl ether acetate (PGMEA), and the methanol and the distilled water remaining in the solution were removed under a reduced pressure, obtaining a polymer represented by the following Chemical Formula A (a weight average molecular weight (Mw)=2500).

[Chemical Formula A]

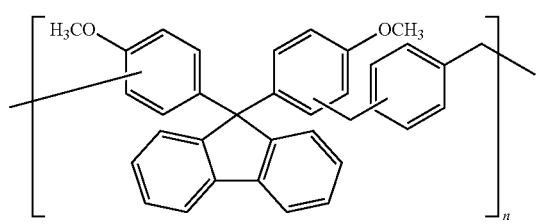

Comparative Synthesis Example 2

A polymer represented by the following Chemical Formula B (a weight average molecular weight (Mw)=2500) was obtained according to the same method as Comparative Synthesis Example 1 by using 23.2 g (0.1 mol) of 4-methoxypyrene, 33.2 g (0.2 mol) of 1,4-bis(methoxymethyl)benzene, 15.8 g (0.1 mol) of 1-methoxynaphthalene, 72.2 g of propylene glycol monomethyl ether acetate (PGMEA) and 0.62 g (4 mmol) of diethylsulfate.

[Chemical Formula B]

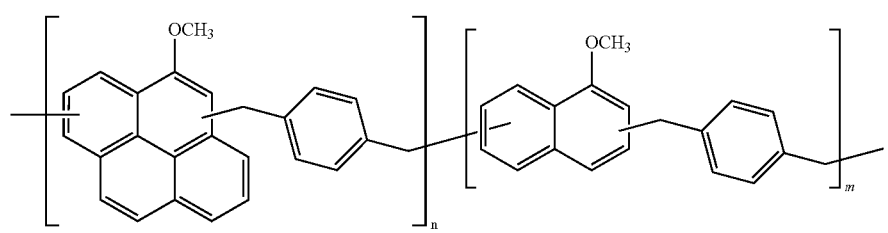

Comparative Synthesis Example 3

30.0 g (0.1 mol) of coronene and 34 g (0.2 mol) of 2-naphthoylchloride were added to a 500 ml two-necked flask equipped with a mechanical agitator and a cooling tube, and dissolved in 300 g of 1,2-dichloroethane. Fifteen minutes later, 15 g (0.11 mol) of trichloro aluminum was slowly added thereto, and then, the reaction solution was reacted at room temperature for 5 hours. When the reaction was terminated, the resultant was treated with water to remove trichloro aluminum, and the residue was concentrated with an evaporator. Next, 160 g of tetrahydrofuran was added to the obtained compound, obtaining a solution. Then, 16 g (0.42 mol) of a sodium borohydride aqueous solution was slowly added to the solution, and the mixture was agitated for 12 hours at room temperature. When the reaction was terminated, the resultant was acidified with a 7% hydrogen chloride solution to about pH 5 and extracted with ethyl acetate, and an organic solvent was removed, obtaining a compound represented by the following Chemical Formula C.

[Chemical Formula C]

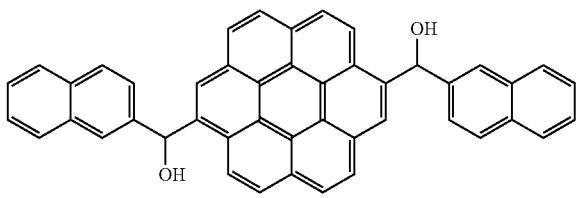

Comparative Synthesis Example 4

40.4 g (0.2 mol) of pyrene and 20 g (0.1 mol) of terephthaloyl chloride were put in a 500 ml two-necked flask equipped with a mechanical agitator and a cooling tube, and then dissolved in 300 g of 1,2-dichloroethane. After 15 minutes, 15 g (0.11 mol) of trichloro aluminum was slowly added thereto, and the obtained reaction solution was reacted at room temperature for 5 hours. When the reaction was terminated, water was used to remove trichloro aluminum therefrom, and the residue was concentrated with an evaporator. Then, 160 g of tetrahydrofuran was added to the obtained compound, obtaining a solution. Next, 16 g (0.42 mol) of a sodium borohydride aqueous solution was slowly added to the solution, and the mixture was agitated for 12 hours at room temperature. When the reaction was terminated, the resultant was acidified with a 7% hydrogen chloride solution to about pH 5 and extracted with ethyl acetate, and an organic solvent therein was removed, obtaining a compound represented by the following Chemical Formula D.

[Chemical Formula D]

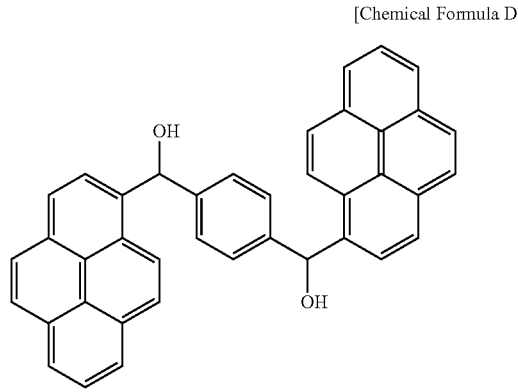

Comparative Synthesis Example 5

A compound represented by the following Chemical Formula E was obtained according to the same method as Comparative Synthesis Example 3 except for using perylene instead of the coronene and benzoylchloride instead of the 2-naphthoylchloride.

[Chemical Formula E]

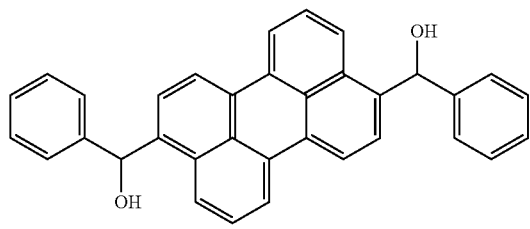

Synthesis Example 1

11.7 g (0.1 mol) of 1H-indole, 18 g (0.1 mol) of 9-fluorenone, 9.5 g (0.05 mol) of p-toluene sulfonic acid hydrate, and 91 g of 1,4-dioxane were put in a flask and agitated at 100° C. The reaction was terminated when a sample taken from the obtained polymerization reactant by every one hour reached a weight average molecular weight of 2000 to 3000. When the reaction was terminated, 100 g of hexane was added thereto to extract 1,4-dioxane, a precipitate obtained by adding methanol thereto was filtered, and a monomer remaining was removed by using methanol, obtaining a polymer represented by the following Chemical Formula 1aa (a weight average molecular weight (Mw)=2500).

[Chemical Formula 1aa]

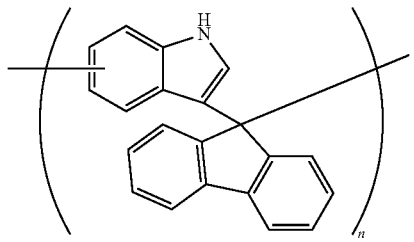

Synthesis Example 2

A polymer represented by the following Chemical Formula 1bb (a weight average molecular weight (Mw)=2300) was obtained according to the same method as Synthesis Example 1 except for using 19.3 g (0.1 mol) of 2-phenyl-1H-indole, 18 g (0.1 mol) of 9-fluorenone, 9.5 g (0.05 mol) of p-toluene sulfonic acid hydrate and 91 g of 1,4-dioxane.

[Chemical Formula 1bb]

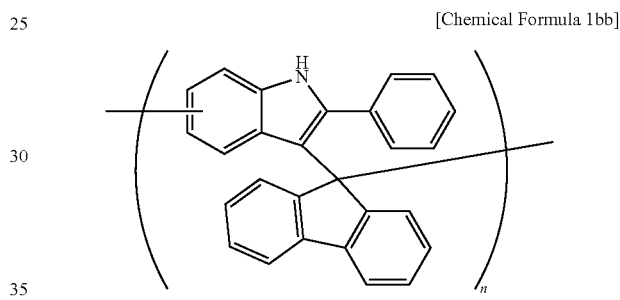

Synthesis Example 3

1 g (3.2 mmol) of 4,4'-dibromo biphenyl was dissolved in 20 mL of tetrahydrofuran, and 3 mL of 2.5 M n-BuLi (in hexane) was slowly add thereto in a dropwise fashion at −78° C. After 30 minutes, 1.2 g (6.4 mmol) of 9-fluorenone dissolved in THF was slowly added thereto in a dropwise fashion, and the mixture was agitated at room temperature for 15 hours. The obtained reaction solution was set at pH=7 by using 1 N hydrochloric acid and extracted with EtOAc, and a solvent therein was removed. A product was separated therefrom through column chromatography, obtaining a compound S1 (Synthesis of Chemical Formula S1).

S1

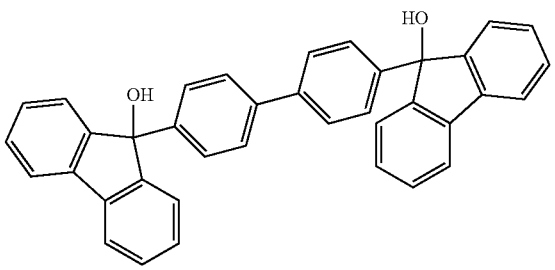

A polymer represented by Chemical Formula 1cc (a weight average molecular weight (Mw)=2900) was obtained according to the same method as Synthesis Example 1 by using 5.9 g (50 mmol) of 1H-indole, 25.7 g (50 mmol) of the compound S1, 4.7 g (25 mmol) of p-toluene sulfonic acid hydrate and 85 g of 1,4-dioxane.

[Chemical Formula 1cc]

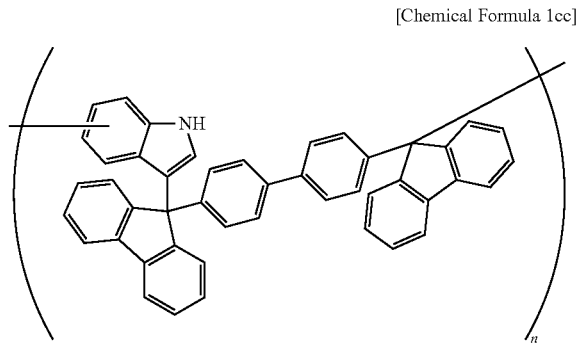

Synthesis Example 4

A polymer represented by Chemical Formula 1dd (a weight average molecular weight (Mw)=2800) was obtained according to the same method as Synthesis Example 1 by using 8.0 g (30 mmol) of 9H-dibenzo[a,c]carbazole, 15.4 g (30 mmol) of the compound S1, 5.7 g (30 mmol) of p-toluene sulfonic acid hydrate and 117 g of 1,4-dioxane.

[Chemical Formula 1dd]

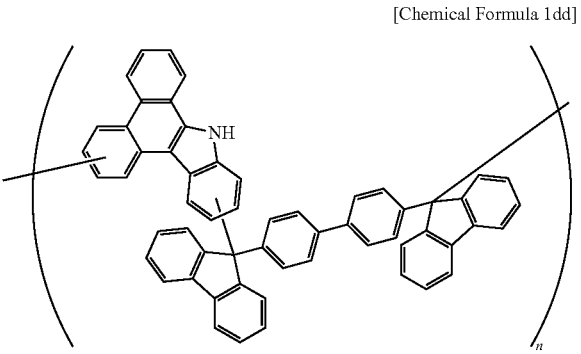

Synthesis Example 5

6.08 g (0.01 mol) of the compound represented by the Chemical Formula C, 1.93 g (0.01 mol) of N-phenylindole, 1.9 g (0.01 mol) of p-toluene sulfonic acid hydrate and 25 g of 1,4-dioxane were put in a flask and agitated at 100° C. The reaction was terminated when a sample taken from the polymerization reactant at every one hour had a weight average molecular weight of 2500 to 3500. When the reaction was terminated, 100 g of hexane was added thereto to extract 1,4-dioxane, water and methanol were added thereto, a precipitate therein was filtered, and a monomer remaining therein was removed by using methanol, obtaining a polymer represented by the following Chemical Formula 1 ee (a weight average molecular weight (MW)=3300).

[Chemical Formula 1ee]

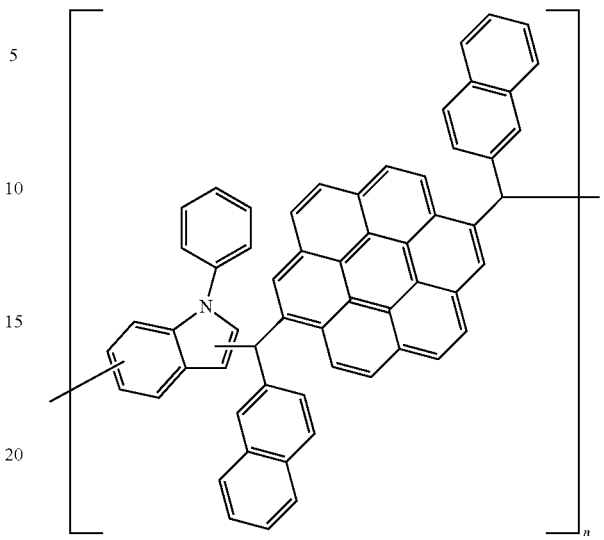

Synthesis Example 6

A polymer represented by the following Chemical Formula 1ff (a weight average molecular weight (MW)=3100) was obtained according to Synthesis Example 5 except for using the compound represented by the Chemical Formula D instead of the compound represented by the Chemical Formula C and 5,7-dihydro-indole[2,3-b]carbazole instead of the N-phenylindole.

[Chemical Formula 1ff]

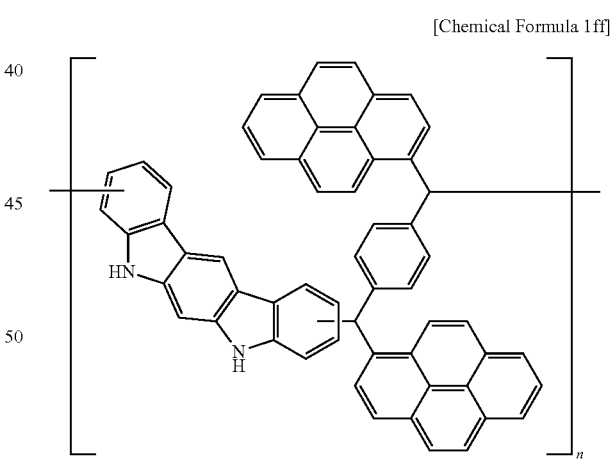

Synthesis Example 7

A polymer represented by the following Chemical Formula 1gg (a weight average molecular weight (MW)=3200) was obtained according to the same method as Synthesis Example 5 except for using the compound represented by the Chemical Formula E instead of the compound represented by the Chemical Formula C and 2,3'-biindole instead of the N-phenylindole.

[Chemical Formula 1gg]

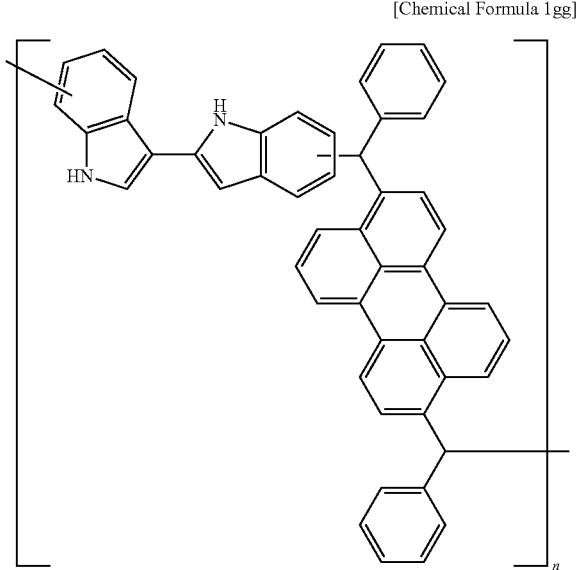

Synthesis Example 8

A polymer represented by the following Chemical Formula 1hh (a weight average molecular weight (Mw)=2300) was obtained according to the same method as Synthesis Example 1 except for using 16.7 g (0.1 mol) of carbazole, 18 g (0.1 mol) of 9-fluorenone, 19 g (0.1 mol) of p-toluene sulfonic acid monohydrate, and 46 g of 1,4-dioxane.

[Chemical Formula 1hh]

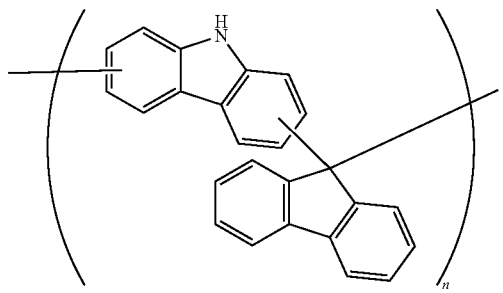

Synthesis Example 9

A polymer represented by the following Chemical Formula 1ii (a weight average molecular weight (Mw)=2100) was obtained according to the same method as Synthesis Example 5 except for using 16.7 g (0.1 mol) of carbazole, 53 g (0.1 mol) of the compound represented by Chemical Formula D, 19 g (0.1 mol) of p-toluene sulfonic acid monohydrate, and 55 g of 1,4-dioxane.

[Chemical Formula 1ii]

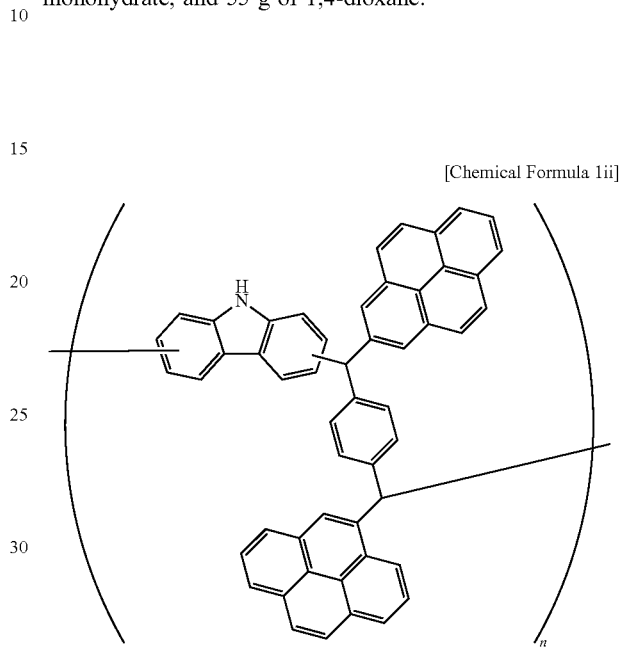

Synthesis Example 10

A polymer represented by the following Chemical Formula 1jj (a weight average molecular weight (Mw)=2300) was obtained according to the same method as Synthesis Example 5 except for using 8.3 g (0.05 mol) of carbazole, 9.7 g (0.05 mol) of 2-phenyl-1H-indole, 18 g (0.1 mol) of 9-fluorenone, 19 g (0.1 mol) of p-toluene sulfonic acid monohydrate and 46 g of 1,4-dioxane.

[Chemical Formula 1jj]

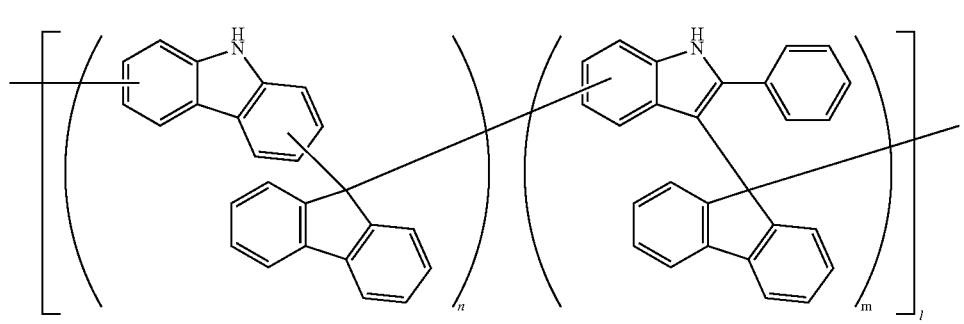

Preparation of Hardmask Composition

Example 1

The compound of Synthesis Example 1 was dissolved in a mixed solvent of propylene glycolmonomethyl ether acetate (PGMEA) and cyclohexanone (7:3 (v/v)), and the solution was filtered, preparing a hardmask composition. Depending on a desired thickness, the amount of the compound was adjusted in a range of 3 to 15 wt % based on the total weight of the hardmask composition.

Example 2

A hardmask composition was prepared according to the same method as Example 1 except for using the compound of Synthesis Example 2 instead of the compound of Synthesis Example 1.

Example 3

A hardmask composition was prepared according to the same method as Example 1 except for using the compound of Synthesis Example 3 instead of the compound of Synthesis Example 1.

Example 4

A hardmask composition was prepared according to the same method as Example 1 except for using the compound of Synthesis Example 4 instead of the compound of Synthesis Example 1.

Example 5

A hardmask composition was prepared according to the same method as Example 1 except for using the compound of Synthesis Example 5 instead of the compound of Synthesis Example 1.

Example 6

A hardmask composition was prepared according to the same method as Example 1 except for using the compound of Synthesis Example 6 instead of the compound of Synthesis Example 1.

Example 7

A hardmask composition was prepared according to the same method as Example 1 except for using the compound of Synthesis Example 7 instead of the compound of Synthesis Example 1.

Example 8

A hardmask composition was prepared according to the same method as Example 1 except for using the compound of Synthesis Example 8 instead of the compound of Synthesis Example 1.

Example 9

A hardmask composition was prepared according to the same method as Example 1 except for using the compound of Synthesis Example 9 instead of the compound of Synthesis Example 1.

Example 10

A hardmask composition was prepared according to the same method as Example 1 except for using the compound of Synthesis Example 10 instead of the compound of Synthesis Example 1.

Comparative Example 1

A hardmask composition was prepared according to the same method as Example 1 except for using the compound of Comparative Synthesis Example 1 instead of the compound of Synthesis Example 1.

Comparative Example 2

A hardmask composition was prepared according to the same method as Example 1 except for using the compound of Comparative Synthesis Example 2 instead of the compound of Synthesis Example 1.

Comparative Example 3

A hardmask composition was prepared according to the same method as Example 1 except for using the compound of Comparative Synthesis Example 3 instead of the compound of Synthesis Example 1.

Comparative Example 4

A hardmask composition was prepared according to the same method as Example 1 except for using the compound of Comparative Synthesis Example 4 instead of the compound of Synthesis Example 1.

Comparative Example 5

A hardmask composition was prepared according to the same method as Example 1 except for using the compound of Comparative Synthesis Example 5 instead of the compound of Synthesis Example 1.

Evaluation

Evaluation 1: Etch Resistance

Each hardmask composition (a compound content: 12 to 15 wt %) of Examples 1 to 10 and Comparative Examples 1 to 5 was spin-on coated to be 4,000 Å thick on a silicon wafer and heat-treated on a hot plate at 400° C. for 2 minutes, forming a thin film.

Subsequently, the thickness of the thin film was measured. Then, the thickness of the thin film was measured again after dry-etching the film with a $CHF_3/CF_4$ mixed gas and a $N_2/O_2$ mixed gas for 100 seconds and 60 seconds, respectively. The thicknesses of the thin film before and after the dry etching and the etching time were used to calculate a bulk etch rate (BER) according to the following Calculation Equation 1.

(thickness of initial thin film−thickness of thin film after etching)/etching time (Å/s)　　[Calculation Equation 1]

The results are provided in Table 1.

TABLE 1

|  | Bulk etch rate (Å/sec) | |
| --- | --- | --- |
|  | $CHF_3/CF_4$ mixed gas | $N_2/O_2$ mixed gas |
| Comparative Example 1 | 30.2 | 28.4 |
| Comparative Example 2 | 29.3 | 27.6 |
| Comparative Example 3 | 25.0 | 25.9 |
| Comparative Example 4 | 27.6 | 26.9 |

TABLE 1-continued

| | Bulk etch rate (Å/sec) | |
|---|---|---|
| | CHF$_3$/CF$_4$ mixed gas | N$_2$/O$_2$ mixed gas |
| Comparative Example 5 | 26.8 | 26.1 |
| Example 1 | 23.2 | 25.1 |
| Example 2 | 22.6 | 23.0 |
| Example 3 | 23.0 | 24.1 |
| Example 4 | 22.7 | 23.8 |
| Example 5 | 22.4 | 23.0 |
| Example 6 | 24.2 | 25.1 |
| Example 7 | 23.9 | 24.2 |
| Example 8 | 22.3 | 23.2 |
| Example 9 | 23.7 | 22.8 |
| Example 10 | 23.5 | 23.9 |

Referring to Table 1, the thin films respectively formed of the hardmask compositions according to Examples 1 to 10 had sufficient etch resistance to etching gas and showed improved bulk etch characteristics compared with the ones respectively formed of the hardmask compositions according to Comparative Examples 1 to 5.

Evaluation 2: Planarization Characteristics and Gap-fill Characteristics

Each hardmask composition according to Examples 1 to 10 and Comparative Examples 1 to 5 was spin-on coated to be 2000 Å thick on a patterned silicon wafer and baked at 400° C. for 120 seconds, forming a thin film.

Gap-fill characteristics were evaluated by examining if there was a void on the cross-section of the pattern with a FE-SEM (a field emission scanning electron microscope). Planarization characteristics were evaluated by measuring thickness of the thin film around the pattern with a thin film thickness meter made by K-MAC and then calculated according to Calculation Equation 2 shown in FIG. 1. Herein, a smaller difference between h1 and h2 indicates better planarization.

The results are provided in Table 2.

TABLE 2

| | Planarization characteristics | Gap-fill characteristics |
|---|---|---|
| Comparative Example 1 | Greater than or equal to 30% | No void |
| Comparative Example 2 | Greater than or equal to 30% | No void |
| Comparative Example 3 | Greater than or equal to 50% | Void |
| Comparative Example 4 | Greater than or equal to 20% | No void |
| Comparative Example 5 | Greater than or equal to 10% | Void |
| Example 1 | Less than or equal to 8% | No void |
| Example 2 | Less than or equal to 8% | No void |
| Example 3 | Less than or equal to 8% | No void |
| Example 4 | Less than or equal to 8% | No void |
| Example 5 | Less than or equal to 8% | No void |
| Example 6 | Less than or equal to 8% | No void |
| Example 7 | Less than or equal to 8% | No void |
| Example 8 | Less than or equal to 8% | No void |
| Example 9 | Less than or equal to 8% | No void |
| Example 10 | Less than or equal to 8% | No void |

Referring to Table 2, the thin films respectively formed of the hardmask compositions according to Examples 1 to 10 showed improved gap-fill and planarization characteristics compared with the ones respectively formed of the hardmask compositions according to Comparative Examples 1 to 5.

By way of summation and review, when a small-sized pattern is to be formed, it may be difficult to provide a fine pattern having an excellent profile using a general lithographic technique. Accordingly, an organic layer, called a hardmask layer, may be formed between the material layer and the photoresist layer to provide a fine pattern. The hardmask layer plays a role of an intermediate layer for transferring the fine pattern of photoresist to the material layer through the selective etching process. Accordingly, it is desirable for the hardmask layer to have characteristics such as etch resistance and the like to tolerate multiple etching processes. Further, forming a hardmask layer by a spin-on coating method instead of the chemical vapor deposition has been considered. The spin-on coating method may be easier to perform and may also improve gap-fill characteristics and planarization characteristics. The gap-fill characteristics of filling a pattern with a film are important because multiple patterns may be used to obtain a fine pattern. In addition, the planarization characteristics of planarizing the surface of the film may be important when a wafer, as a substrate for coating, has a bump, or has a dense pattern region and a no-pattern region.

As described above, embodiments may provide a polymer that ensures etch resistance and planarization characteristics simultaneously.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising a moiety represented by the following Chemical Formula 1:

[Chemical Formula 1]

wherein, in the Chemical Formula 1,

A$^1$ a divalent group of one of the compounds listed in the following Group 1 such that each of the two valences of A$^1$ is a bond to a fused ring of A$^1$, provided that, when A$^1$ is

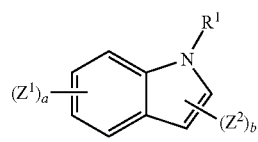

of Group 1, then A$^1$ is a bound to A$^3$ by the nitrogen-containing ring of

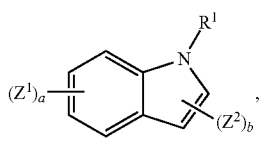

A² is a divalent group of one of the compounds listed in the following Group 1 such that each of the two valences of A² is a bond to a fused ring of A²,
A³ is one of the groups listed in the following Group 2, and
m is 0 or 1:
[Group 1]
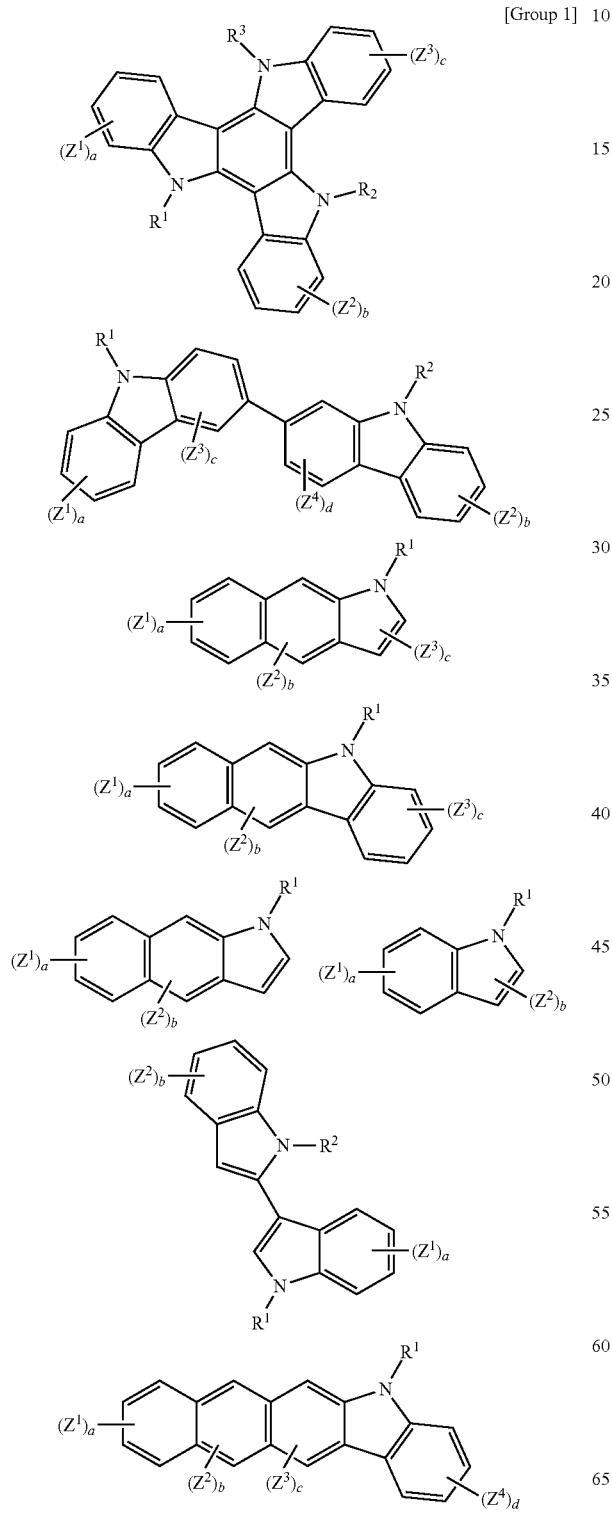
-continued
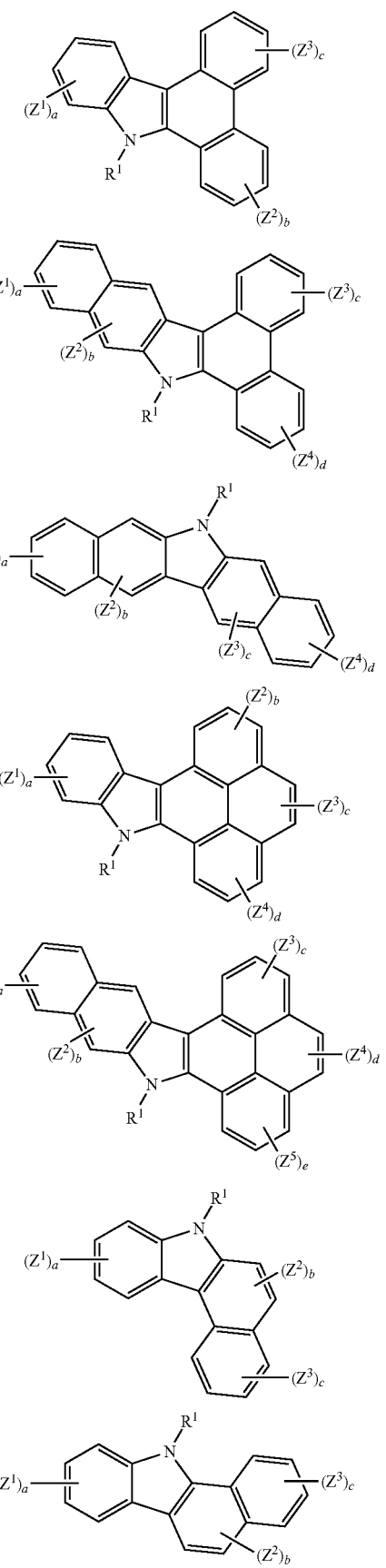

-continued

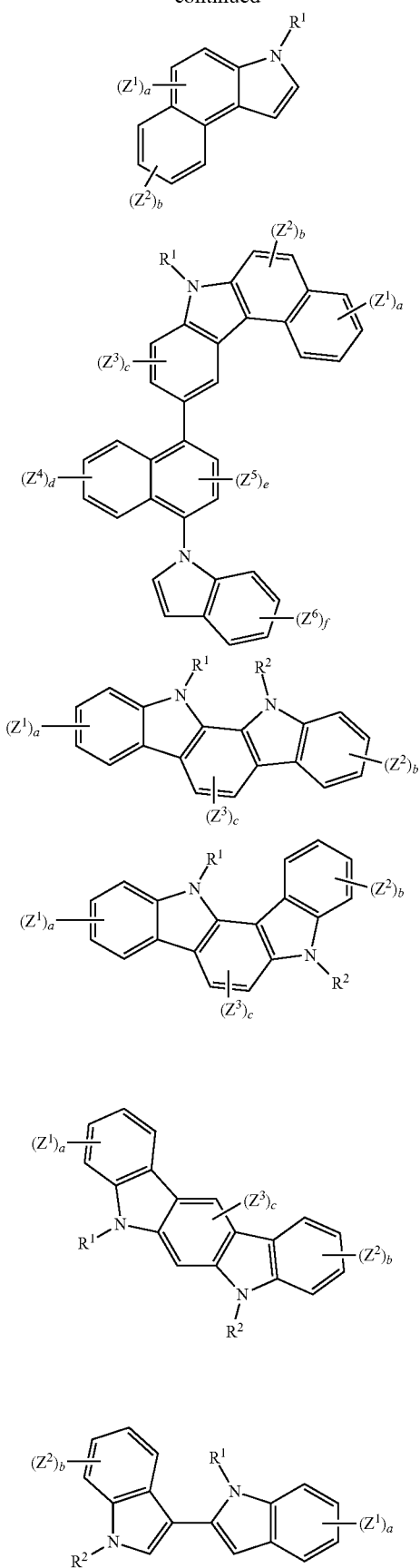

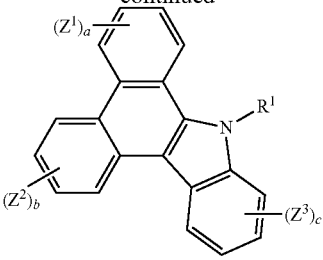

wherein, in the Group 1,
R¹, R² and R³ are independently hydrogen, a hydroxy group, oxygen, a methoxy group, an ethoxy group, a halogen, a substituted or unsubstituted C6 to C30 aryl group, or a combination thereof,
$Z^1$ to $Z^6$ are independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and
a, b, c, d, e and f are independently integers of 0 to 2,

[Group 2]

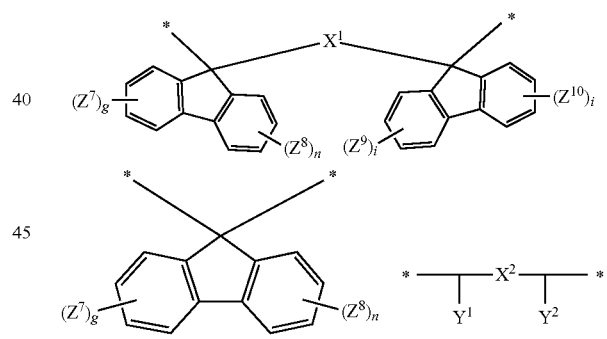

wherein, in the Group 2,
X¹ and X² are independently a substituted or unsubstituted C6 to C50 arylene group, a substituted or unsubstituted C1 to C10 alkyleneoxide-containing group, or a combination thereof,
Y¹ and Y² are independently a substituted or unsubstituted C6 to C30 aryl group,
$Z^7$ to $Z^{10}$ are independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and g, h, i and j are independently integers of 0 to 2.

2. The polymer as claimed in claim 1, wherein in the Group 2, $X^1$ and $X^2$ are independently a divalent group derived from one of the compounds listed in the following Group 3:

[Group 3]

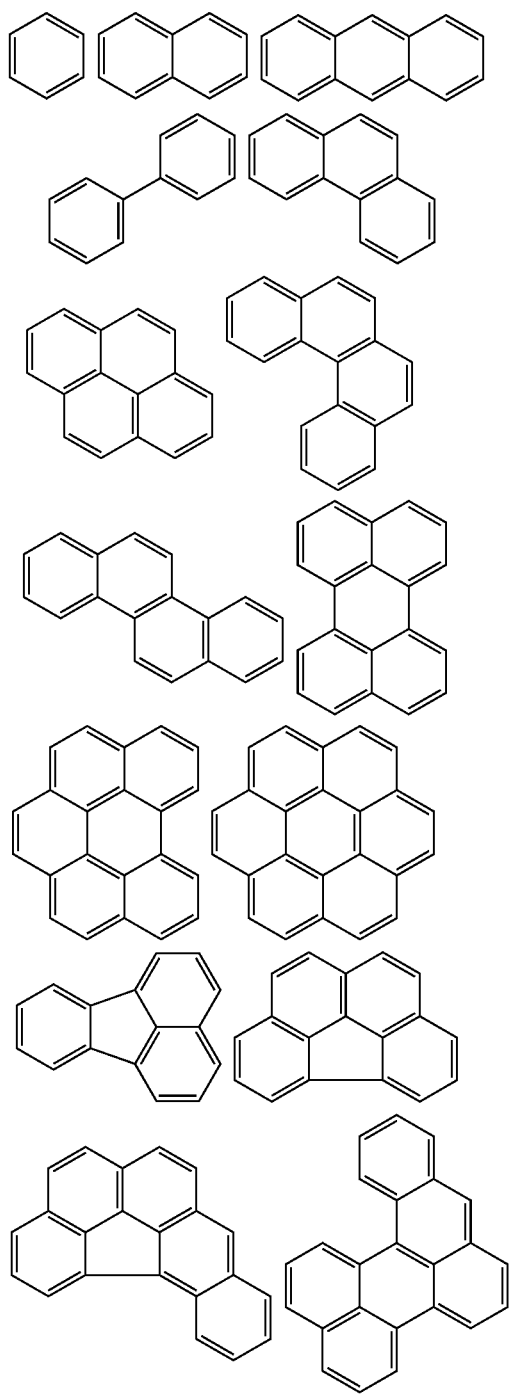

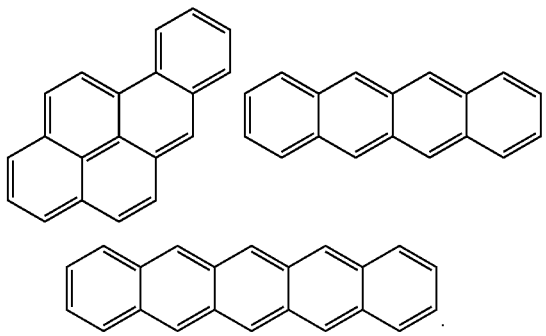

3. The polymer as claimed in claim 1, wherein, in the Group 2, $Y^1$ and $Y^2$ are independently a monovalent group derived from one of the compounds listed in the following Group 3:

[Group 3]

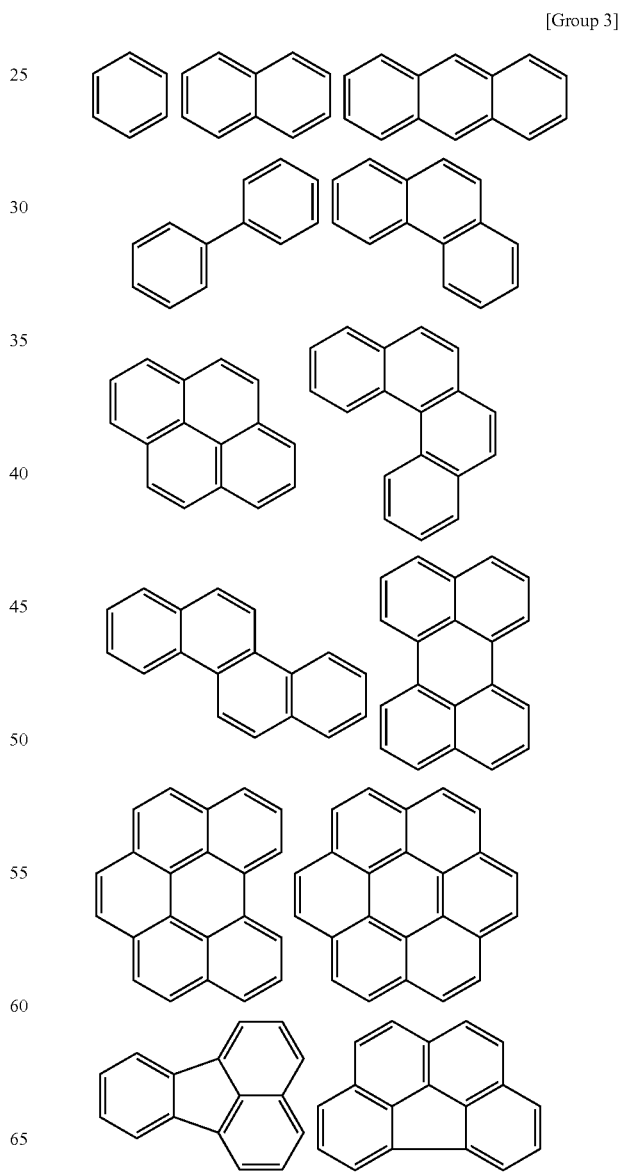

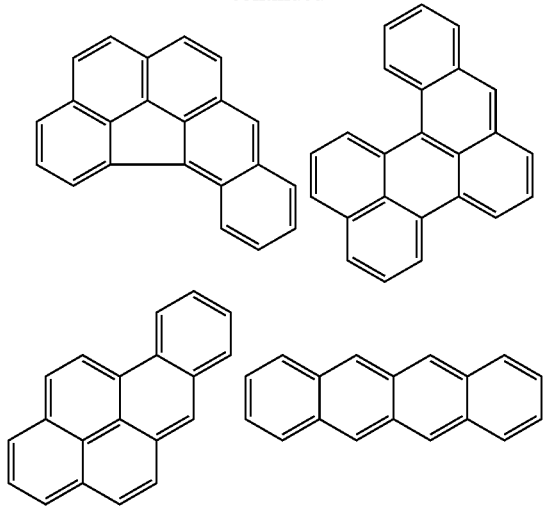

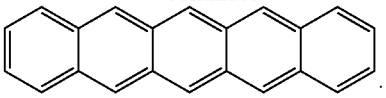 [SMILES: c1ccc2cc3cc4cc5ccccc5cc4cc3cc2c1]

4. The polymer as claimed in claim 1, wherein in the Group 2, at least one of $X^2$, $Y^1$ and $Y^2$ is a group derived from a substituted or unsubstituted benzene, a substituted or unsubstituted naphthalene, a substituted or unsubstituted biphenyl, a substituted or unsubstituted pyrene, a substituted or unsubstituted perylene, a substituted or unsubstituted benzoperylene, a substituted or unsubstituted coronene, or a combination thereof.

5. The polymer as claimed in claim 1, wherein, in the Group 1, $R^1$, $R^2$ and $R^3$ are independently hydrogen, or a substituted or unsubstituted phenyl group.

6. The polymer as claimed in claim 1, which is represented by one of the following Chemical Formulae:

[Chemical Formula 2-1]

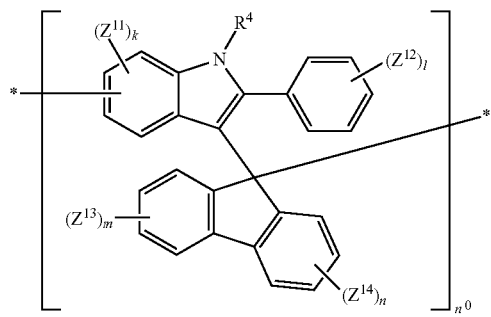

[Chemical Formula 2-2]

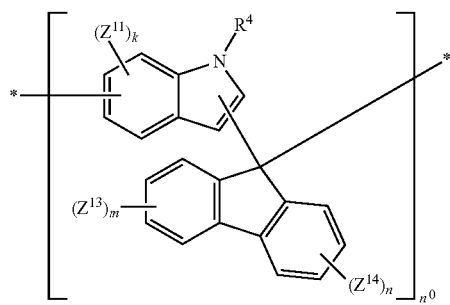

[Chemical Formula 2-3]

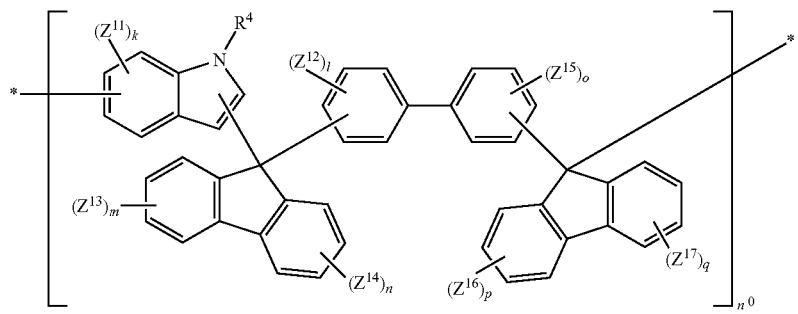

[Chemical Formula 2-4]
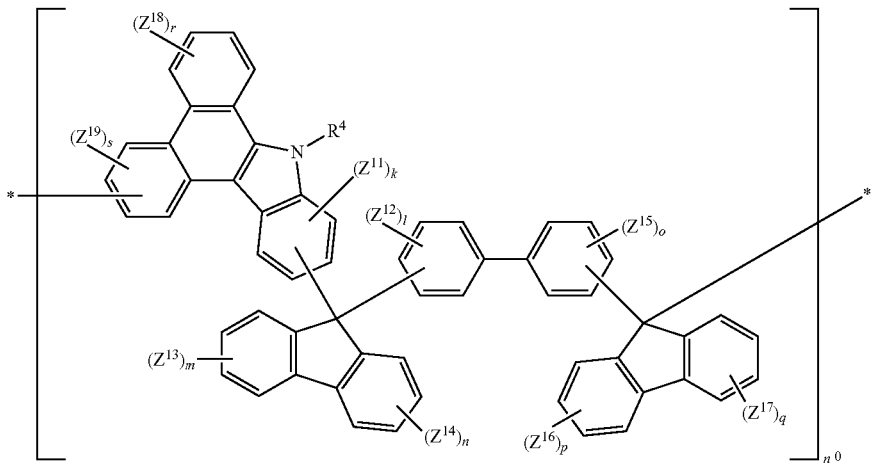
[Chemical Formula 2-5]
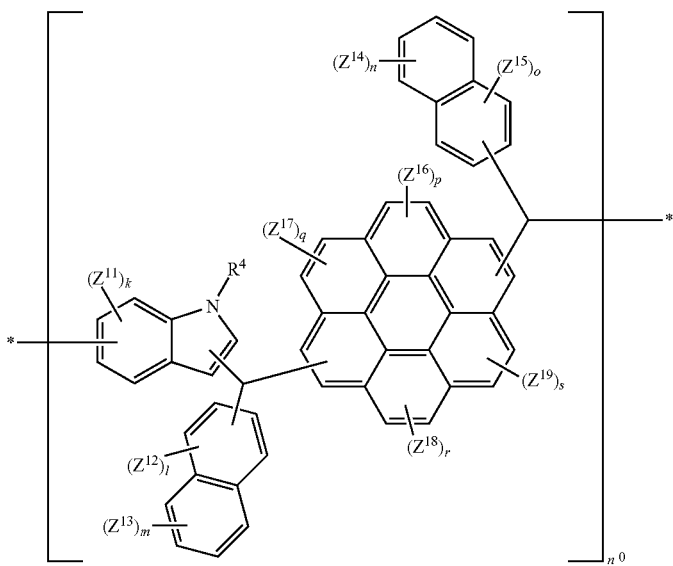
[Chemical Formula 2-6]
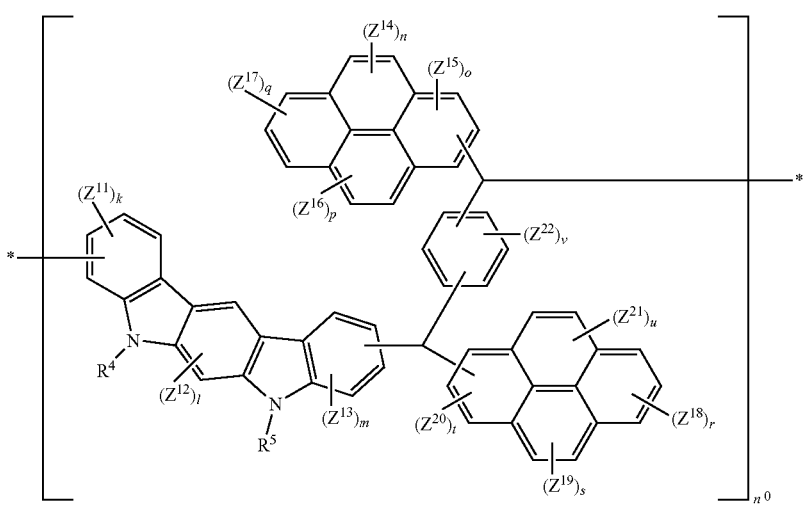

[Chemical Formula 2-7]

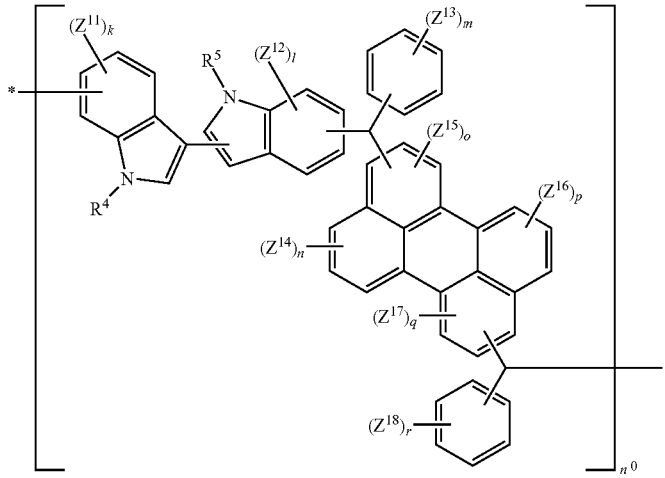

wherein, in the above Chemical Formulae, $R^4$ and $R^5$ are independently hydrogen, a hydroxy group, oxygen, a halogen, a substituted or unsubstituted C6 to C30 aryl group, or a combination thereof, $Z^{11}$ to $Z^{22}$ are independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, t, u and v are independently integers of 0 to 2, and $n^0$ is an integer of 2 to 300.

7. The polymer as claimed in claim 1, which has a weight average molecular weight of about 1,000 to about 200,000.

8. An organic layer composition comprising
the polymer as claimed in claim 1, and
a solvent.

9. The organic layer composition as claimed in claim 8, wherein the polymer is included in an amount of about 0.1 wt % to about 30 wt % based on the total weight of the organic layer composition.

10. An organic layer formed by curing the organic layer composition as claimed in claim 8.

11. The organic layer as claimed in claim 10, wherein the organic layer is a hardmask layer.

12. A method of forming patterns, the method comprising:
providing a material layer on a substrate;
applying the organic layer composition as claimed in claim 8 on the material layer;
heat-treating the organic layer composition to form a hardmask layer;
forming a silicon-containing thin layer on the hardmask layer;
forming a photoresist layer on the silicon-containing thin layer;
exposing and developing the photoresist layer to form a photoresist pattern;
selectively removing the silicon-containing thin layer and the hardmask layer using the photoresist pattern to expose a part of the material layer; and
etching an exposed part of the material layer.

13. The method as claimed in claim 12, wherein the organic layer composition is applied using a spin-on coating method.

14. The method as claimed in claim 12, wherein the process of forming the organic layer includes heat-treating at about 100° C. to about 500° C.

15. The method as claimed in claim 12, further comprising forming a bottom antireflective coating (BARC) before forming the photoresist layer.

* * * * *